United States Patent
Fischer et al.

(10) Patent No.: US 10,559,475 B2
(45) Date of Patent: *Feb. 11, 2020

(54) CONTROL OF DIRECTIONALITY IN ATOMIC LAYER ETCHING

(71) Applicant: Lam Research Corporation, Fremont, CA (US)

(72) Inventors: Andreas Fischer, Castro Valley, CA (US); Thorsten Lill, Santa Clara, CA (US); Richard Janek, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/255,606

(22) Filed: Jan. 23, 2019

(65) Prior Publication Data

US 2019/0157105 A1    May 23, 2019

Related U.S. Application Data

(63) Continuation of application No. 15/615,691, filed on Jun. 6, 2017, now Pat. No. 10,229,837, which is a (Continued)

(51) Int. Cl.
*H01L 21/3213* (2006.01)
*H01L 21/02* (2006.01)
(Continued)

(52) U.S. Cl.
CPC .... *H01L 21/32136* (2013.01); *H01L 21/0206* (2013.01); *H01L 21/02068* (2013.01);
(Continued)

(58) Field of Classification Search
None
See application file for complete search history.

(56) References Cited

U.S. PATENT DOCUMENTS

| 4,592,801 A | 6/1986 | Hara et al. |
| 4,756,794 A | 7/1988 | Yoder |

(Continued)

FOREIGN PATENT DOCUMENTS

| CN | 1550575 A | 12/2004 |
| CN | 1552097 A | 12/2004 |

(Continued)

OTHER PUBLICATIONS

Lee et al ("Selectivity in Thermal Atomic Layer Etching Using Sequential, Self-Limiting Fluorination and Ligand-Exchange Reactions", Chem. Mater. 2016, vol. 28, pp. 7657-7665). (Year: 2016).*

(Continued)

*Primary Examiner* — Shamim Ahmed
(74) *Attorney, Agent, or Firm* — Penilla IP, APC

(57) ABSTRACT

A method for performing atomic layer etching (ALE) on a substrate is provided, including the following operations: performing a surface modification operation on a substrate surface, the surface modification operation configured to convert at least one monolayer of the substrate surface to a modified layer, wherein a bias voltage is applied during the surface modification operation, the bias voltage configured to control a depth of the substrate surface that is converted by the surface modification operation; performing a removal operation on the substrate surface, the removal operation configured to remove at least a portion of the modified layer from the substrate surface, wherein removing the portion of the modified layer includes applying thermal energy to effect desorption of the portion of the modified layer. A plasma treatment can be performed to remove residues from the substrate surface following the removal operation.

23 Claims, 19 Drawing Sheets

Related U.S. Application Data continuation-in-part of application No. 15/423,486, filed on Feb. 2, 2017.

(60) Provisional application No. 62/464,360, filed on Feb. 27, 2017, provisional application No. 62/291,392, filed on Feb. 4, 2016.

(51) Int. Cl.
| | | |
|---|---|---|
| *H01L 21/311* | (2006.01) | |
| *H01L 21/225* | (2006.01) | |
| *H01L 21/326* | (2006.01) | |
| *H01L 21/67* | (2006.01) | |

(52) U.S. Cl.
CPC ...... *H01L 21/225* (2013.01); *H01L 21/31122* (2013.01); *H01L 21/326* (2013.01); *H01L 21/32138* (2013.01); *H01L 21/67* (2013.01)

(56) References Cited

U.S. PATENT DOCUMENTS

| | | | |
|---|---|---|---|
| 5,411,631 | A | 5/1995 | Hori et al. |
| 5,501,893 | A | 3/1996 | Laermer et al. |
| 6,022,806 | A | 2/2000 | Sato et al. |
| 6,083,413 | A | 7/2000 | Sawub et al. |
| 6,177,353 | B1 | 1/2001 | Gutsche et al. |
| 6,448,192 | B1 | 9/2002 | Kaushik |
| 6,482,745 | B1 | 11/2002 | Hwang |
| 7,049,226 | B2 | 5/2006 | Chung et al. |
| 7,196,955 | B2 | 3/2007 | Nickel |
| 7,416,989 | B1 | 8/2008 | Liu et al. |
| 7,795,148 | B2 | 9/2010 | Brown |
| 7,943,527 | B2 | 5/2011 | Kumar et al. |
| 8,058,179 | B1 | 11/2011 | Draeger et al. |
| 8,110,503 | B2 | 2/2012 | Kumar et al. |
| 8,227,344 | B2 | 7/2012 | Selsley et al. |
| 8,252,194 | B2 | 8/2012 | Kiehlbauch et al. |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,130,158 | B1 | 9/2015 | Shen et al. |
| 9,240,315 | B1 | 1/2016 | Hsieh et al. |
| 9,257,638 | B2 | 2/2016 | Tan et al. |
| 9,449,843 | B1 | 9/2016 | Korolik et al. |
| 9,576,811 | B2 | 2/2017 | Kanarik et al. |
| 9,805,941 | B2 | 10/2017 | Kanarik et al. |
| 9,806,252 | B2 | 10/2017 | Tan et al. |
| 9,837,312 | B1 | 12/2017 | Tan et al. |
| 9,870,899 | B2 | 1/2018 | Yang et al. |
| 9,984,858 | B2 | 5/2018 | Kanarik et al. |
| 9,997,371 | B1 | 6/2018 | Agarwal et al. |
| 10,056,268 | B2 | 8/2018 | Li |
| 10,096,487 | B2 | 10/2018 | Yang et al. |
| 10,186,426 | B2 | 1/2019 | Kanarik et al. |
| 2001/0053585 | A1 | 12/2001 | Kikuchi et al. |
| 2002/0009883 | A1 | 1/2002 | Ogure et al. |
| 2002/0058409 | A1 | 5/2002 | Lin et al. |
| 2002/0081381 | A1 | 6/2002 | DelaRosa et al. |
| 2004/0004056 | A1 | 1/2004 | Sasaki et al. |
| 2004/0137749 | A1 | 7/2004 | Ying et al. |
| 2004/0209476 | A1 | 10/2004 | Ying et al. |
| 2005/0006222 | A1 | 1/2005 | Ding et al. |
| 2005/0098440 | A1 | 5/2005 | Kailasam et al. |
| 2005/0112901 | A1 | 5/2005 | Ji et al. |
| 2005/0167399 | A1 | 8/2005 | Ludviksson et al. |
| 2006/0009040 | A1 | 1/2006 | Tomioka et al. |
| 2006/0169669 | A1 | 8/2006 | Zojaji et al. |
| 2006/0194435 | A1 | 8/2006 | Nishimura et al. |
| 2007/0049036 | A1 | 3/2007 | Huang |
| 2007/0202254 | A1 | 8/2007 | Ganguli et al. |
| 2007/0238301 | A1 | 10/2007 | Cabral et al. |
| 2007/0246442 | A1 | 10/2007 | America et al. |
| 2009/0020884 | A1 | 1/2009 | Lee et al. |
| 2009/0075472 | A1 | 3/2009 | Arnold et al. |
| 2009/0226611 | A1 | 9/2009 | Suzuki et al. |
| 2009/0256220 | A1 | 10/2009 | Horng et al. |
| 2010/0048029 | A1 | 2/2010 | Kumar et al. |
| 2011/0139748 | A1 | 6/2011 | Donnelly et al. |
| 2011/0200762 | A1 | 8/2011 | Kumar et al. |
| 2011/0212274 | A1 | 9/2011 | Selsley et al. |
| 2012/0009785 | A1 | 1/2012 | Chandrashekar et al. |
| 2012/0115329 | A1 | 5/2012 | Chandrashekar et al. |
| 2012/0276657 | A1 | 11/2012 | Joubert et al. |
| 2013/0105303 | A1 | 5/2013 | Lubomirsky et al. |
| 2013/0129922 | A1 | 5/2013 | Sasagawa et al. |
| 2013/0137267 | A1 | 5/2013 | Chang et al. |
| 2013/0168354 | A1 | 7/2013 | Kanarik |
| 2014/0134847 | A1 | 5/2014 | Seya |
| 2014/0193979 | A1 | 7/2014 | Or et al. |
| 2014/0273492 | A1 | 9/2014 | Anthis et al. |
| 2014/0349469 | A1 | 11/2014 | Sasagawa et al. |
| 2015/0037972 | A1 | 2/2015 | Danek et al. |
| 2015/0111374 | A1 | 4/2015 | Bao et al. |
| 2015/0214474 | A1 | 7/2015 | Nishimura et al. |
| 2015/0228495 | A1* | 8/2015 | Joubert ............. H01L 21/67069 438/714 |
| 2015/0235835 | A1 | 8/2015 | Swaminathan et al. |
| 2015/0243883 | A1 | 8/2015 | Swaminathan et al. |
| 2015/0270140 | A1 | 9/2015 | Gupta et al. |
| 2016/0020152 | A1 | 1/2016 | Posseme |
| 2016/0035581 | A1* | 2/2016 | Posseme ............... H01L 21/306 438/705 |
| 2016/0056074 | A1 | 2/2016 | Na et al. |
| 2016/0064244 | A1 | 3/2016 | Agarwal et al. |
| 2016/0079521 | A1 | 3/2016 | Draeger et al. |
| 2016/0203995 | A1 | 7/2016 | Kanarik et al. |
| 2016/0308112 | A1 | 10/2016 | Tan et al. |
| 2016/0314985 | A1 | 10/2016 | Yang et al. |
| 2016/0358782 | A1 | 12/2016 | Yang et al. |
| 2016/0379824 | A1 | 12/2016 | Wise et al. |
| 2017/0040214 | A1 | 2/2017 | Lai et al. |
| 2017/0053808 | A1 | 2/2017 | Kamp et al. |
| 2017/0053810 | A1 | 2/2017 | Yang et al. |
| 2017/0069462 | A1 | 3/2017 | Kanarik et al. |
| 2017/0117159 | A1 | 4/2017 | Kanarik et al. |
| 2017/0125256 | A1 | 5/2017 | Lee et al. |
| 2017/0186621 | A1* | 6/2017 | Zaitsu ............... H01J 37/32146 |
| 2017/0229311 | A1 | 8/2017 | Tan et al. |
| 2017/0229314 | A1 | 8/2017 | Tan et al. |
| 2017/0256416 | A1 | 9/2017 | Fischer et al. |
| 2017/0316935 | A1 | 11/2017 | Tan et al. |
| 2018/0019387 | A1 | 1/2018 | Tan et al. |
| 2018/0033635 | A1 | 2/2018 | Kanarik et al. |
| 2018/0102236 | A1 | 4/2018 | Yang et al. |
| 2018/0233325 | A1 | 8/2018 | Kanarik et al. |
| 2018/0308680 | A1 | 10/2018 | Reddy et al. |
| 2018/0308695 | A1 | 10/2018 | LaVoie |

FOREIGN PATENT DOCUMENTS

| | | |
|---|---|---|
| JP | 5416280 B2 | 2/2014 |
| WO | WO 2011/081921 A2 | 7/2011 |
| WO | WO 2016/100873 A1 | 6/2016 |

OTHER PUBLICATIONS

Pomeroy, R.K. and Wijesekera, K.S. (1980) "Preparation and derivatives of cis-M(CO)$_4$(SiCl$_3$)$_2$ (M=Fe, Ru, Os)," *Inorg. Chem.*, 19(12):3729-3735.

Jiang et al. (1998) "Complexes Containing Unbridged Dative Metal-Metal Bonds and the Strong Acceptor Ru(Co)$_3$(SiCl$_3$)$_2$ Moiety. Comments on the Transition Metal to Silicon Bond," *Organometallics*, 17(26):5810-5819.

Wolf, S. and Tauber, R.N. (1986) "Silicon Processing for the VLSI Era," vol. 1—*Process Technology, Lattice Press*, pp. 542-557.

Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7pp.

(56) References Cited

OTHER PUBLICATIONS

Puurunen, Rikka L. (2005) "Surface chemistry of atomic layer deposition: A case study for the trimethylaluminum/water process," *Journal of Applied Physics*, 97:121301-51 pages.

Park, S.D. et al., (Sep. 22, 2005) "Surface Roughness Variation during Si Atomic Layer Etching by Chlorine Adsorption Followed by an Ar Neutral Beam Irradiation," *Electrochemical and Solid-State Letters*, 8(11):C177-C179, 1 page [Abstract Only].

Schmitt et al. (2006) "Synthesis and Properties of Single-Crystal FeSi Nanowires," *Nano Lett.*, 6(8):1617-1621.

Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.

Boullart et al. (Mar. 29, 2013) "STT MRAM patterning challenges," *Proc. SPIE, Advanced Etch Technology for Nanopatterning II, Proc. of SPIE* 8685:86850F-1-86850E-9 [Retrieved on Jun. 2, 2015 from http://proceedings.spiedigitallibrary.org].

Kim et al. (Nov./Dec. 2013) "Atomic layer etching removal of damaged layers in a contact hole for low sheet resistance," *J. Vac. Sci. Technol. A*, 31(6):061302-1-061302-7.

Carver et al. (Feb. 20, 2015) "Atomic Layer Etching: An Industry Perspective," *ECS Journal of Solid State Science and Technology*,4(6):N5005-N5009.

Faraz et al. (2015) "Atomic Layer Etching: What Can We Learn from Atomic Layer Deposition?," *ECS Journal of Solid State Science and Technology*, 4(6):N5023-N5032.

Lee et al. (2015) "Atomic Layer Etching of $Al_2O_3$ Using Sequential, Self-Limiting Terhmal Reactions with $Sn(acac)_2$ and Hydrogen Fluoride," *ACS NANO* ,9(2):2061-2070.

Kanarik et al. (Mar./Apr. 2015) "Overview of atomic layer etching in the semiconductor industry," *J. Vac. Sci. Technol. A*, 33(2):020802-1-020802-14.

Moroz, Paul (Jul. 1-2, 2015) "Numerical Simulation of Stomic Layer Etching," Atomic Layer Etching Workshop, Portland, Oregon, USA; *Tokyo Electron U.S. Holdings, Inc.*, 15pp.

Younghee Lee et al. "Selectivity in Thermal Atomic Layer Etching Using Sequential, Self-Limiting Fluorination and Ligand-Exchange Reactions" Chemistry of Materials, Oct. 2016, vol. 28, Issue 21, pp. 7657-7665 See pages 7657-7660 and figure 1.

Kanarik et al. (2017) "Predicting synergy in atomic layer etching," *J. Vac. Sci. Technol. A*,35(5):05C302-1 through 05C302-7.

Gottscho, Richard (Jul. 16, 2017) "Atomic Layer Etching—An Overview of Possibilities and Limitations," *Plenary Talk presented at American Vacuum Society 17$^{th}$ International Conference on Atomic Layer Deposition (ALD 2017) and 4$^{th}$ International Atomic Layer Etching Workshop (Ale 2017)*, Lam Research Corp., 21pp.

Chinese First Office Action, dated Dec. 27, 2017, issued in CN Application No. 2016100179.11.4.

Chinese First Office Action, dated Mar. 30, 2018, issued in CN Application No. 201610248296.8.

PCT International Search Report and the Written Opinion of the International Searching Authority, or the Declaration, issued in International Application No. PCT/US2018/019784, dated Jun. 12, 2018, (12 total pages).

Singapore Search Report and Written Opinion, dated Jun. 14, 2018, issued in SG Application No. 10201600099V.

Singapore Search Report and Written Opinion, dated Jun. 28, 2018, issued in SG Application No. 10201603090V.

Chinese First Office Action, dated Jun. 26, 2018, issued CN Application No. 201610255293.7.

Singapore Search Report and Written Opinion, dated Jul. 9, 2018, issued in SG Application No. 10201603092R.

Chinese Second Office Action, dated Aug. 31, 2018, issued in CN Application No. 201610017911.4.

Happich, J., et al., (2018) "Atomic layer etching yields 2.5nm wide FinFETs," eeNews Europe, pp. 1-4 [retrieved on Dec. 12, 2018] <URL:http://www.eenewseurope.com/news/atomic-layer-etching-yields-25nm-wide-finfets#>.

Chinese Second Office Action, dated Dec. 27, 2018, issued in CN Application No. 201610248296.8.

\* cited by examiner

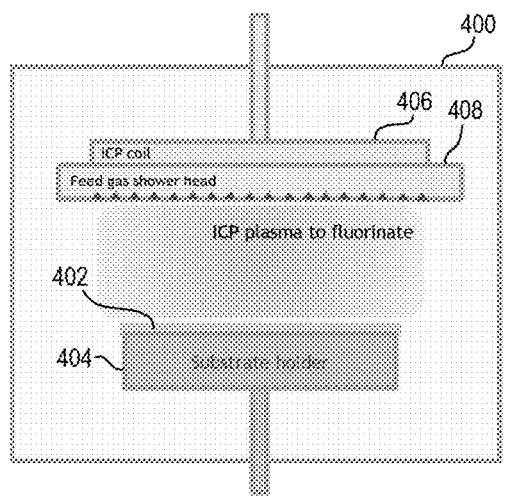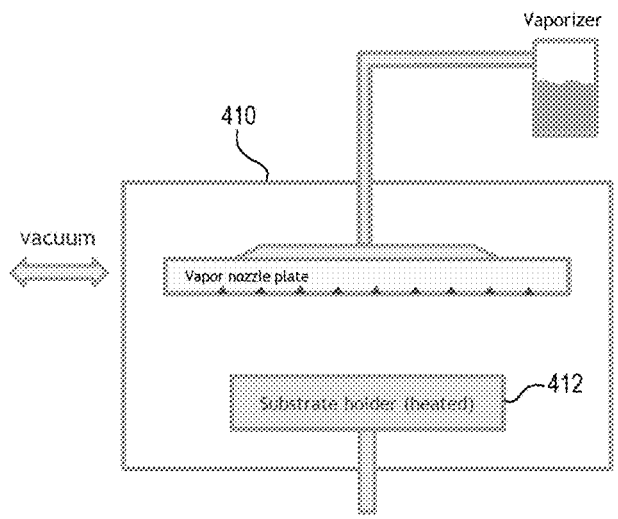
FIG. 4A
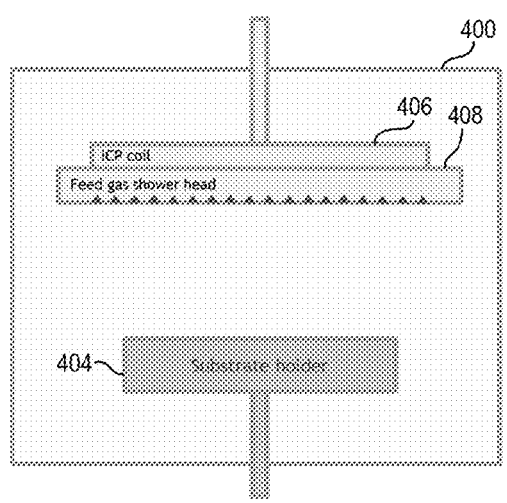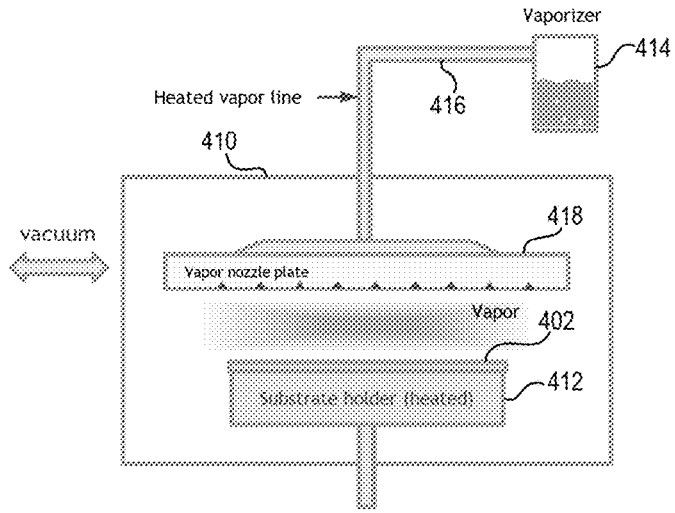
FIG. 4B

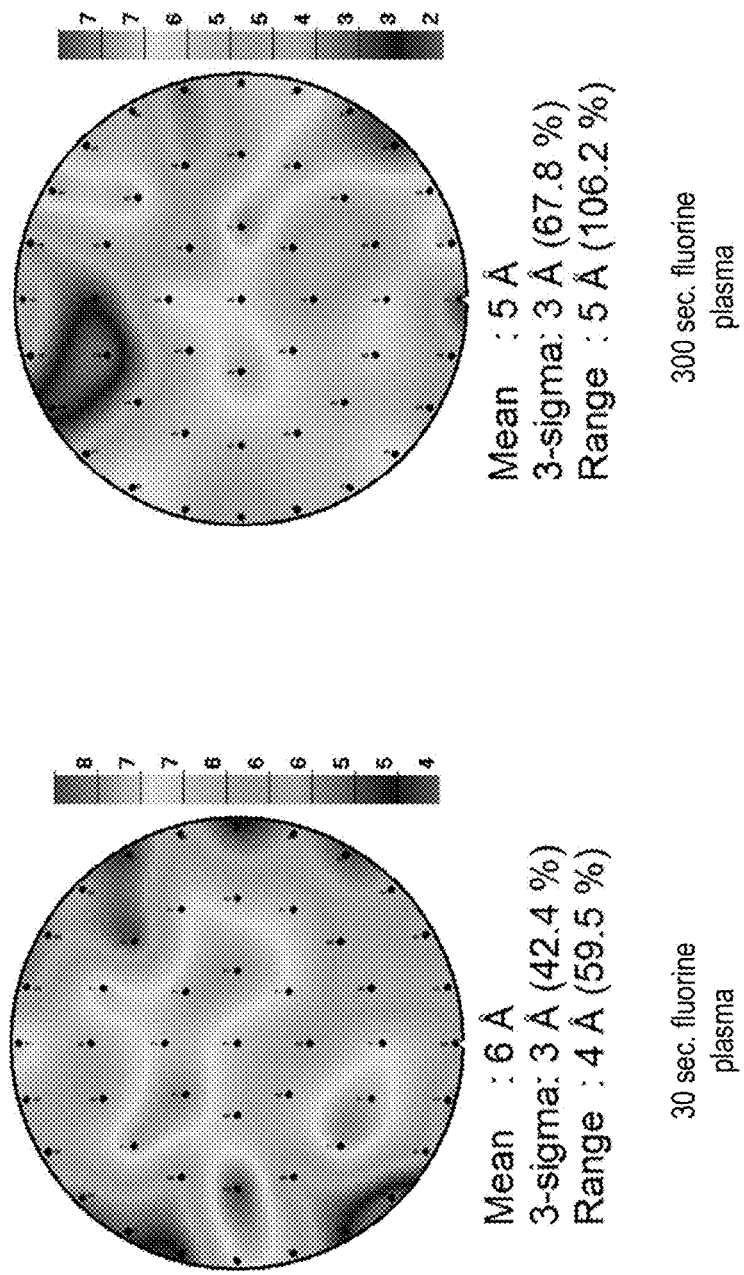

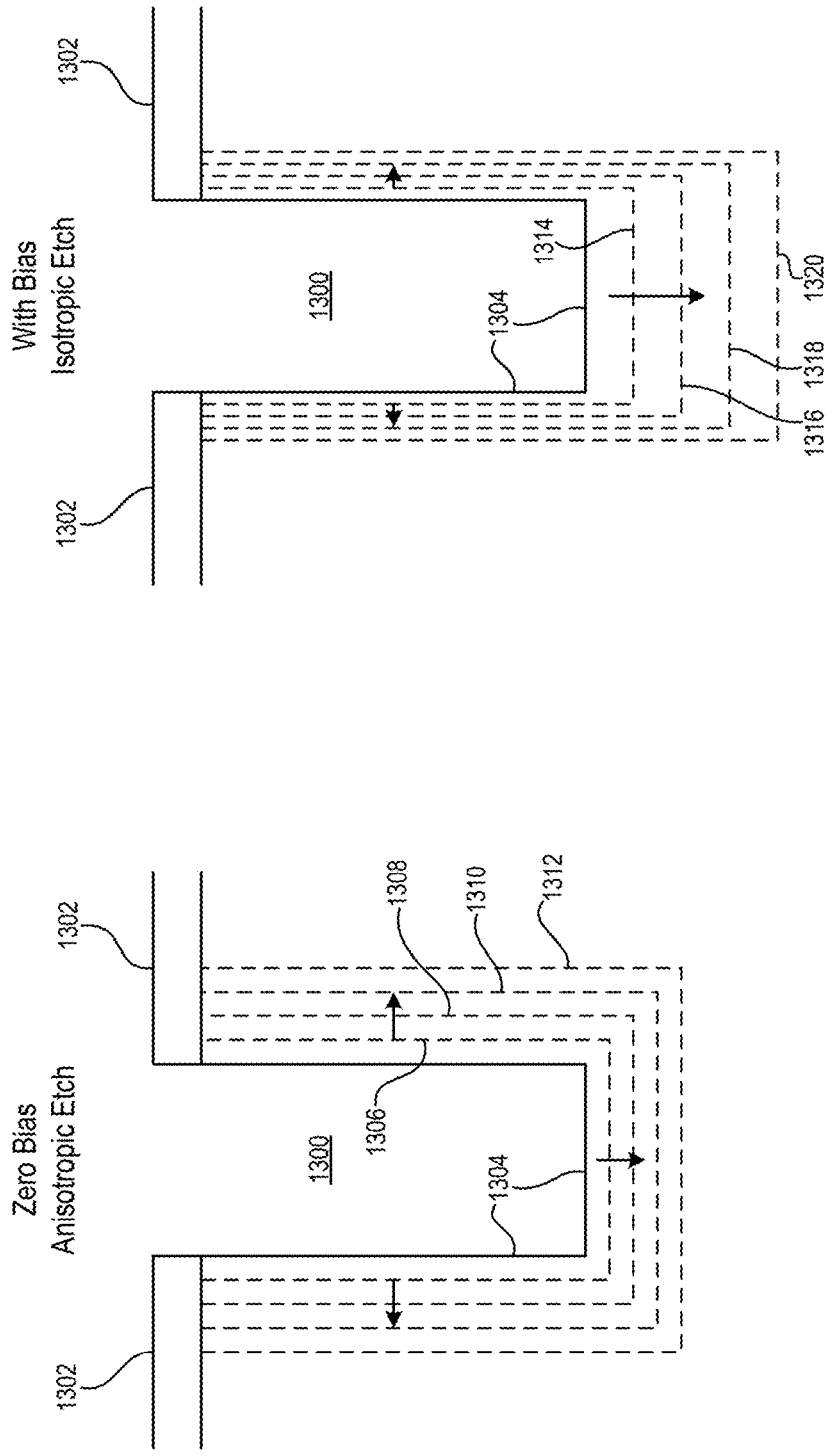

CONTROL OF DIRECTIONALITY IN ATOMIC LAYER ETCHING

CLAIM OF PRIORITY

This application claims priority as a continuation of U.S. application Ser. No. 15/615,691, filed Jun. 6, 2017, entitled "CONTROL OF DIRECTIONALITY IN ATOMIC LAYER ETCHING." U.S. application Ser. No. 15/615,691 claims priority to U.S. application Ser. No. 15/423,486, filed Feb. 2, 2017, entitled "ATOMIC LAYER ETCHING 3D STRUCTURES: SI AND SIGE AND GE SMOOTHNESS ON HORIZONTAL AND VERTICAL SURFACES," which claims priority to U.S. Provisional Application No. 62/291,392, filed Feb. 4, 2016, entitled "ATOMIC LAYER ETCHING 3D STRUCTURES: SI AND SIGE AND GE SMOOTHNESS ON HORIZONTAL AND VERTICAL SURFACES." U.S. application Ser. No. 15/615,691 further claims priority to U.S. Provisional Application No. 62/464,360, filed Feb. 27, 2017, entitled "CONTROL OF DIRECTIONALITY IN ATOMIC LAYER ETCHING." The disclosures of these applications are incorporated by reference herein.

FIELD OF THE INVENTION

Implementations of the present disclosure relate to atomic layer etching (ALE), and more specifically to control of directionality in atomic layer etching.

DESCRIPTION OF THE RELATED ART

Conventional techniques of etching material on semiconductor substrates with fine-tuned control over the uniformity and etch rate are limited. For example, reactive ion etch is conventionally used to etch materials on a semiconductor substrate during semiconductor processing and etch rates of materials etched using reactive ion etch are controlled by modulating radio frequency plasma power and chemistry selection. Typically, a wafer plasma sheath forms at the top of the substrate, and thus ions from the plasma are typically accelerated onto the wafer surface to etch the substrate. However, as technology nodes progress to atomic-scale devices, control of etch processes with atomic-scale fidelity will be required.

SUMMARY

In accordance with some implementations, a method for performing atomic layer etching (ALE) on a substrate is provided, including the following operations: performing a surface modification operation on a substrate surface, the surface modification operation configured to convert at least one monolayer of the substrate surface to a modified layer, wherein a bias voltage is applied during the surface modification operation, the bias voltage configured to control a depth of the substrate surface that is converted by the surface modification operation; performing a removal operation on the substrate surface, the removal operation configured to remove at least a portion of the modified layer from the substrate surface, wherein removing the portion of the modified layer is effected via a ligand exchange reaction that is configured to volatilize the portion of the modified layer.

In some implementations, the surface modification operation is configured to diffuse ions into the substrate surface to the depth as controlled by the bias voltage.

In some implementations, the bias voltage is configured to have a magnitude and a time duration during the surface modification operation to achieve the depth of the substrate surface that is converted by the surface modification operation.

In some implementations, the depth is defined by one or more monolayers of the substrate.

In some implementations, the bias voltage is configured to shift the surface modification operation from being primarily isotropic to being primarily anisotropic, depending on a magnitude of the bias voltage.

In some implementations, the bias voltage is applied during part of the surface modification operation, the part during which the bias voltage is applied to increase an amount of the depth in a vertical direction that increases anisotropy of the ALE, and a portion during which the bias voltage is not applied to increase the depth in a non-vertical direction that increases isotropy of the ALE.

In some implementations, the method further includes: performing, following the removal operation, a plasma treatment on the substrate surface, the plasma treatment configured to remove residues generated by the removal operation and/or the surface modification operation from the substrate surface, wherein the residues are volatilized by the plasma treatment.

In some implementations, the removal operation is configured to remove less than an entire portion of the modified layer from the substrate surface; and, the method further comprising: repeating the removal operation and the plasma treatment until the entire portion of the modified layer is removed from the substrate surface.

In some implementations, the method further includes: repeating the surface modification operation, the removal operation and the plasma treatment until a predefined thickness has been etched from the substrate surface.

In some implementations, the bias voltage is in the range of approximately 20 to 100 V.

In some implementations, performing the surface modification operation includes exposing the substrate surface to a fluorine-containing plasma, wherein the exposure to the fluorine-containing plasma is configured to convert the at least one monolayer of the substrate surface to a fluoride species.

In some implementations, the substrate surface includes a metal, metal oxide, metal nitride, metal phosphide, metal sulfide, metal arsenide, or metal compound; wherein the exposure to the fluorine-containing plasma forms a metal fluoride.

In some implementations, exposing the substrate surface to the fluorine-containing plasma includes introducing a fluorine-containing gas into a chamber in which the substrate is disposed, and igniting a plasma.

In some implementations, the exposure to the fluorine-containing plasma is performed at a chamber pressure of about 10 to 500 mTorr, for a duration of less than about 15 seconds.

In some implementations, performing the removal operation includes exposing the substrate surface to tin-(II) acetylacetonate ($Sn(acac)_2$) vapor, the exposure to the $Sn(acac)_2$ vapor configured to exchange acetylacetonate (acac) ligands for fluorine atoms in the modified layer.

In some implementations, exposing the substrate surface to the $Sn(acac)_2$ includes introducing the $Sn(acac)_2$ as a vapor into a chamber in which the substrate is disposed.

In some implementations, the exposure to the $Sn(acac)_2$ is performed for a duration of about 1 to 30 seconds.

In some implementations, performing the plasma treatment includes exposing the substrate surface to a hydrogen plasma, the exposure to the hydrogen plasma configured to volatilize tin, tin fluoride or tin oxide residues on the substrate surface.

In some implementations, exposing the substrate surface to the hydrogen plasma includes introducing a hydrogen gas into a chamber in which the substrate is disposed, and igniting a plasma.

In some implementations, the exposure to the hydrogen plasma is performed for a duration of about 1 to 30 seconds.

In some implementations, the surface modification operation is performed in a first chamber; wherein the removal operation is performed in a second chamber.

In some implementations, a method for performing atomic layer etching (ALE) on a substrate is provided, including the following operations: performing a surface modification operation on a substrate surface, the surface modification operation including exposing the substrate surface to a first plasma that converts at least one monolayer of the substrate surface to a modified layer, wherein a bias voltage is applied during the surface modification operation, the bias voltage being configured to control a depth of the substrate surface that is converted by the surface modification operation, wherein the bias voltage is configured to accelerate ions from the first plasma towards the substrate surface without substantially etching the substrate surface; performing a removal operation on the substrate surface, the removal operation including removing at least a portion of the modified layer from the substrate surface, wherein removing the portion of the modified layer is effected via a ligand exchange reaction that is configured to volatilize the portion of the modified layer; performing a clean operation on the substrate surface, the clean operation including removing residues generated by the removal operation from the substrate surface, the clean operation further including exposing the substrate surface to a second plasma, wherein the residues are volatilized by the exposure to the second plasma.

BRIEF DESCRIPTION OF THE DRAWINGS

FIGS. 4A-4C illustrate performance of ALE process operations in a plasma treatment chamber and a vapor treatment chamber, in accordance with implementations of the disclosure.

FIGS. 9A and 9B illustrate film loss following a 30 second fluorine plasma exposure versus a 300 second fluorine plasma exposure, respectively, in accordance with implementations of the disclosure.

FIG. 13A conceptually illustrates a cross section of a substrate surface feature, and performance of an anisotropic ALE process performed thereon, in accordance with implementations of the disclosure.

FIG. 13B conceptually illustrates a cross section of a substrate surface feature, and performance of an isotropic ALE process performed thereon, in accordance with implementations of the disclosure.

DETAILED DESCRIPTION

Figure 1:
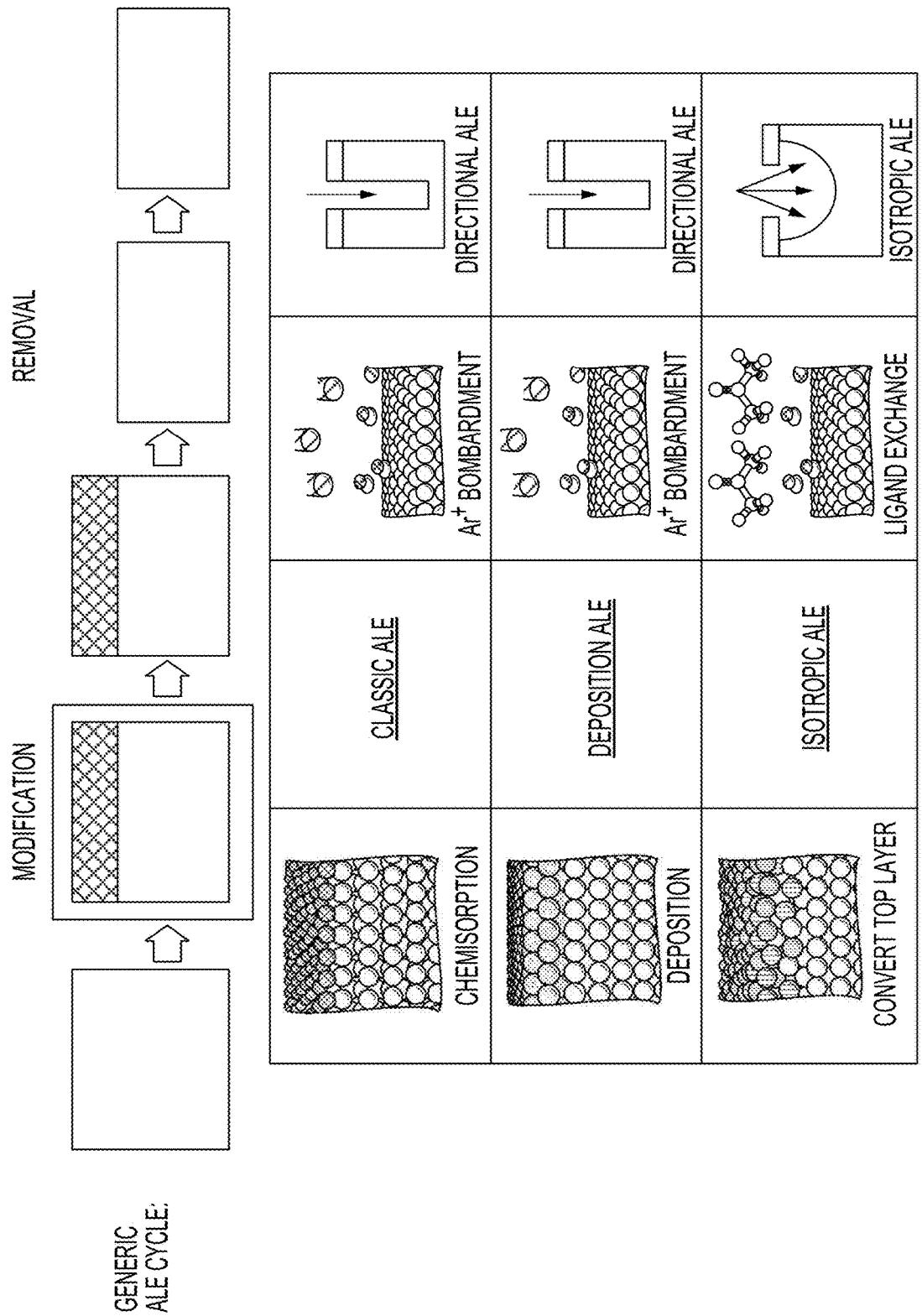
FIG. 1 illustrates various classifications of ALE, in accordance with implementations of the disclosure.

In the following description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations will be described in conjunction with the specific implementations, it will be understood that it is not intended to limit the disclosed implementations.

Provided herein are methods of controlling directionality of atomic layer etching (ALE) of metal oxides (such as aluminum oxide ($Al_2O_3$)) via a ligand exchange mechanism involving a fluorine-containing plasma and a tin-containing etchant. Methods described herein involve modifying a surface of the material to be etched using a fluorine-containing plasma and exposing the modified surface to tin-(II) acetylacetonate ($Sn(acac)_2$) vapor to remove the material in a self-limiting manner. A ligand exchange reaction is sustained in a vapor deposition chamber with $Sn(acac)_2$ vapor without plasma.

Atomic layer etching (ALE) is one approach for atomic scale control of etching behavior. ALE is a type of cycling process. ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various implementations, ALE may be performed with plasma, or may be performed thermally.

An ALE process sequence can be described as follows, in accordance with implementations of the disclosure. Initially, a portion of a surface of a substrate is in an unmodified state. The outermost layer (or surface layer) of molecules/atoms of the substrate surface are exposed for the ALE process. A surface conversion/modification operation is performed to convert the surface layer of the substrate to a functionalized state. For example, the surface layer is modified by exposure to a surface conversion reactant, which may adsorb or chemisorb on the surface. The surface conversion reactant can include molecules or low energy radicals in various implementations, which react with the surface layer atoms to effect the surface conversion operation. The resulting surface layer includes a functionalized outermost layer of molecules to enable subsequent ALE steps. In some implementations, the operation is self-limiting, and only (or substantially only) the outermost layer of the substrate surface will undergo conversion. In some implementations, the specific depth of the conversion is controlled, at least in part via application of a bias voltage which also affects directionality of the conversion, as described in further detail below. In some implementations, this surface conversion entails conversion of the surface species to a halide. In some implementations, following the (self-limiting) surface conversion, the chamber is purged to remove any reaction byproducts or excess surface conversion reactant.

Following the surface conversion operation, then a ligand exchange reaction/operation is performed. The modified surface layer of the substrate is exposed to a ligand containing reactant, which effects a ligand exchange reaction wherein the ligand containing reactant adsorbs on the substrate surface and transfers its ligands to the converted surface species which were formed during the earlier surface conversion/modification operation. The ligands bond with the modified surface layer of molecules/atoms, forming a reaction product including ligand substituted surface species, which can be released.

Desorption drives removal of the outermost layer of surface species (the reaction product following the ligand exchange operation) from the substrate surface. In some implementations, the release can be achieved by the application of thermal energy, which can be applied simultaneously with the exposure to the ligand containing reactant or in a separate step (e.g. by heating the chuck/chamber, lamp heating, etc.).

The concept of an "ALE cycle" is relevant to the discussion of various implementations herein. Generally, an ALE cycle is the minimum set of operations used to perform an etch process one time, such as etching a monolayer or a predefined thickness of the outer layer of the substrate. The result of one cycle is that at least some of a film layer on a substrate surface is etched. Typically, an ALE cycle includes a modification operation to form a reactive layer, followed by a removal operation to remove or etch, in whole or in part, only this reactive layer.

Modification may be performed by using a chemisorption mechanism, deposition mechanism, top layer conversion mechanism, or extraction mechanism. The cycle may include certain ancillary operations such as sweeping one of the reactants or byproducts. Generally, a cycle contains one instance of a unique sequence of operations.

As an example, a method for an ALE cycle may include the following operations: (i) delivery of a reactant gas, (ii) optional purging of the reactant gas from the chamber, (iii) delivery of a removal gas and an optional plasma, and (iv) optional purging of the chamber. Further description and examples of ALE are described in U.S. patent application Ser. No. 14/696,254, filed on Apr. 24, 2015 and titled "INTEGRATING ATOMIC SCALE PROCESSES: ALD (ATOMIC LAYER DEPOSITION) AND ALE (ATOMIC LAYER ETCH)," which is incorporated herein by reference for purposes of describing atomic layer etch processes.

Disclosed implementations result in highly controlled etching methods with a high degree of uniformity. Disclosed implementations may be used to perform isotropic etching of various materials and may also be modified to perform anisotropic etching by applying a bias at a bias voltage between about 20 $V_b$ and about 80 $V_b$, such as at about 50 $V_b$.

ALE may be done by a surface modification operation (e.g., chemisorption by reactive chemistry on a substrate surface) followed by a removal operation. Such operations may be repeated for a certain number of cycles. During ALE, the reactive chemistry and the removal chemistry are delivered separately to the substrate.

Isotropic atomic layer etching (ALE) of $Al_2O_3$ has been demonstrated via a ligand exchange method utilizing a fluorine plasma for the surface modification step and tin-(II) acetylacetonate ($Sn(acac)_2$) vapor for the non-plasma removal step. In implementations wherein the steps are performed in the absence of any directional energy to the wafer, such as provided via ion bias, the overall etch process is isotropic. However, in accordance with implementations of the present disclosure, anisotropy can be introduced in a controlled way to an isotropic baseline process through the controlled application of a bias voltage.

In various implementations, processes are performed in suitable process equipment/chambers (e.g. Kiyo for fluorination, and ICS for vapor treatment, both of which are manufactured by Lam Research Corporation).

Atomic layer etching of $Al_2O_3$ using sequential plasma fluorination and self-limiting thermal reactions with tin(II)-acetylacetonate ($Sn(acac)_2$) has been demonstrated. One approach for performing ALE of $Al_2O_3$ is to perform a spatial ALE process wherein the wafer (with $AL_2O_3$ top layer) is cycled between a plasma treatment chamber (for performing fluorination) and a vapor treatment chamber (for performing removal of $AlF_3$ with $Sn(acac)_2$ vapor) without breaking vacuum. Another approach for performing ALE is to perform both the plasma treatment and the vapor treatment in a single chamber, so that the wafer does not need to be moved between different chambers.

FIG. 1 illustrates various classifications of ALE, in accordance with implementations of the disclosure. Broadly speaking, in a generic ALE process, a modification operation is performed, followed by a removal operation. The purpose of the modification operation is to weaken the surface layer without actually etching it. One technique for modifying the surface is via chemisorption, which is self-limiting by Langmuir kinetics. Another way to modify the surface for ALE is via deposition. In this case, the deposition is not necessarily self-limited unless it is ALD. Even so, the removal step can be limited by reactant availability. A third way for performing the surface modification is via a conversion reaction. One example of a conversion is halogenation of the top layer. This is a diffusion-limited process and can be performed via a plasma, bath, or other methods.

Depending on the specifics in the removal step, e.g. ion assisted or via ligand exchange, it is possible to obtain directional or isotropic ALE.

One use case for ALE is in addressing a problem known as the "four-color challenge." Broadly speaking, the four-color challenge poses the problem of removing one specific color out of four without corner rounding, wherein each color represents a different material.

By way of example, isotropic ALE could enable etching of a single "color" via a ligand exchange involving trans-metalation.

An unstable reaction by-product or a non-existent ligand exchange mechanism would prevent etching of the other three "colors" thereby providing selectivity to the etched color.

Table I below provides examples of ligand exchange pre-cursors, including $Sn(acac)_2$, $Al(CH_3)_3$, $AlCl(CH_3)_2$, $SiCl_4$, and the amount of material removed per cycle, as demonstrated with reference to Y. Lee, C. Huffman, S. M. George, "Selectivity in Thermal Atomic Layer Etching Using Sequential, Self-Limiting Fluorination and Ligand-Exchange Reactions", Chem. Mater., 2016, 28 (21), pp 7657-7665. As shown, etch selectivity is also achievable depending upon the particular pre-cursor utilized.

TABLE I

| Modification Molecule | Removal Molecule | Etching | No Etching |
|---|---|---|---|
| HF | $Sn(acac)_2$ | $Al_2O_3$ (0.23 Å) | $SiO_2$ |
| | | $ZrO_2$ (0.14 Å) | SiN |
| | | $HfO_2$ (0.06 Å) | TiN |
| | $Al(CH_3)_3$ (TMA) | $Al_2O_3$ (0.45 Å) | $SiO_2$ |
| | | $HfO_2$ (0.10 Å) | SiN |
| | | | TiN |
| | | | $ZrO_2$ |
| | $Al(CH_3)_2Cl$ (DMAC) | $ZrO_2$ (0.96 Å) | $SiO_2$ |
| | | $HfO_2$ (0.77 Å) | SiN |
| | | $Al_2O_3$ (0.32 Å) | TiN |
| | $SiCl_4$ | $ZrO_2$ (0.14 Å) | $SiO_2$ |
| | | $HfO_2$ (0.05 Å) | SiN |
| | | | TiN |
| | | | $Al_2O_3$ |

Figure 2:
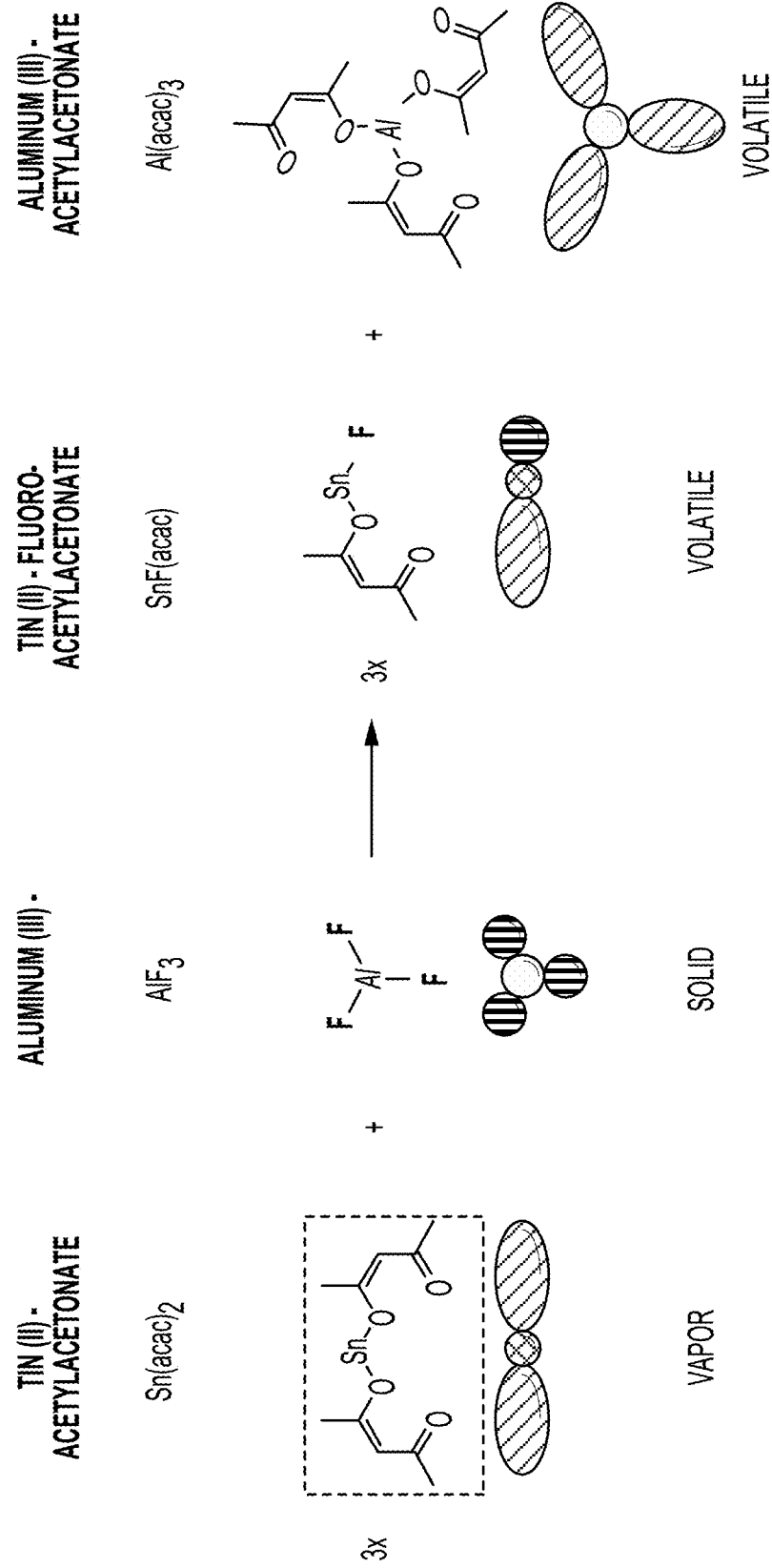
FIG. 2 illustrates the chemical reaction of an ALE process for etching $Al_2O_3$, in accordance with implementations of the disclosure.

FIG. 2 illustrates the chemical reaction of a removal step of an ALE process for etching $Al_2O_3$, in accordance with implementations of the disclosure. As has been noted, the surface portion of $Al_2O_3$ is first converted to $AlF_3$ by performing a surface modification/conversion step. Then, as shown, tin(II)-acetylacetonate (vapor) is provided to react with the aluminum(III)-fluoride (solid), to yield tin(II)-fluoro-acetylacetonate and aluminum(III)-acetylacetonate, both of which are volatile at the chosen process temperature. As the reaction products are volatile, they can be removed from the surface and evacuated from the chamber.

Figure 3:
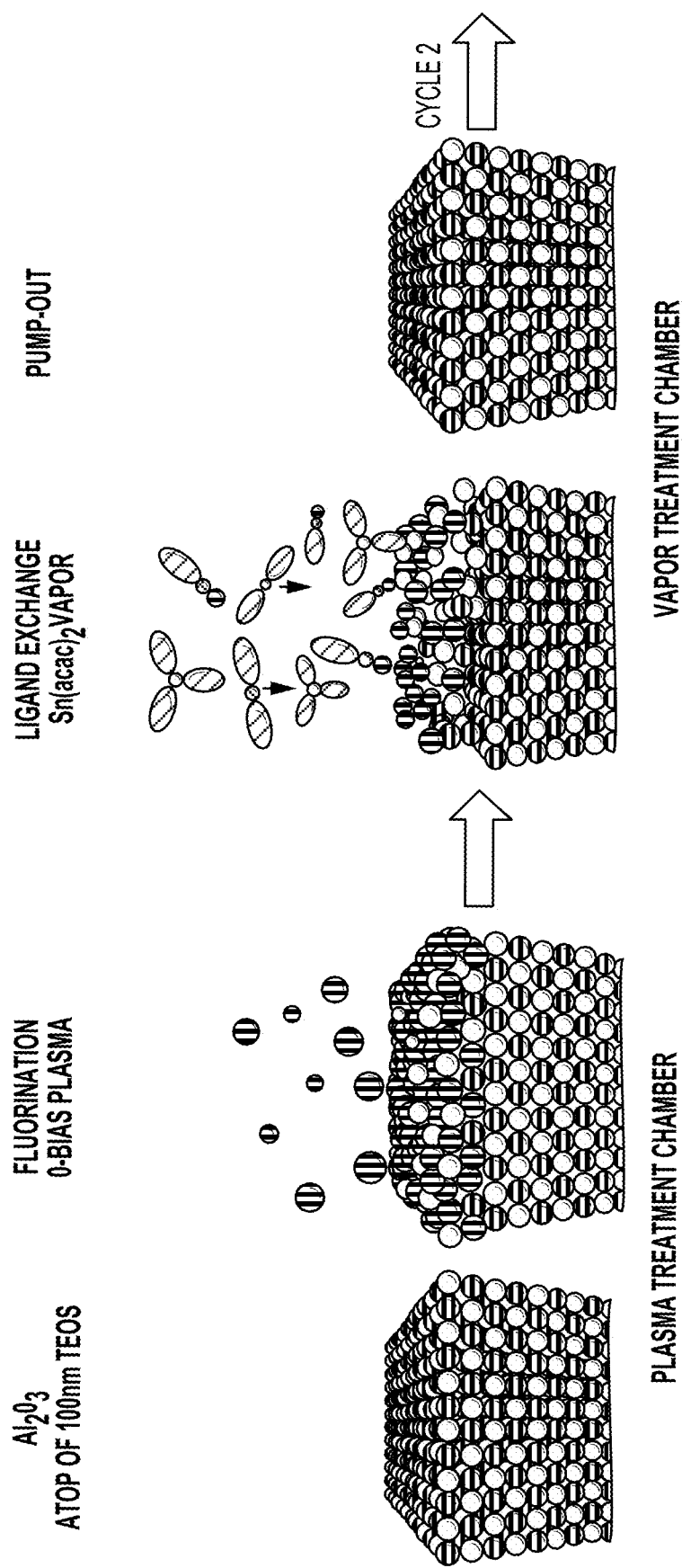
FIG. 3 illustrates an ALE process for etching $Al_2O_3$, in accordance with implementations of the disclosure.

FIG. 3 illustrates an ALE process for etching $Al_2O_3$, in accordance with implementations of the disclosure. Initially, a substrate with an $Al_2O_3$ surface is situated in a plasma treatment chamber. Then the $Al_2O_3$ surface is fluorinated, by way of example, utilizing a 0-bias ICP plasma (i.e. no RF power applied to the wafer pedestal). After completion, the substrate is moved, without breaking vacuum, into a vapor treatment chamber in which the $Sn(acac)_2$-based ligand exchange reaction with the fluorinated surface takes place. A final chamber pump-out step completes the first ALE cycle after which the wafer can be shuttled back to the plasma treatment chamber for the next ALE cycle. Alternatively, all cycles can be performed in a single chamber.

Figure 4C:
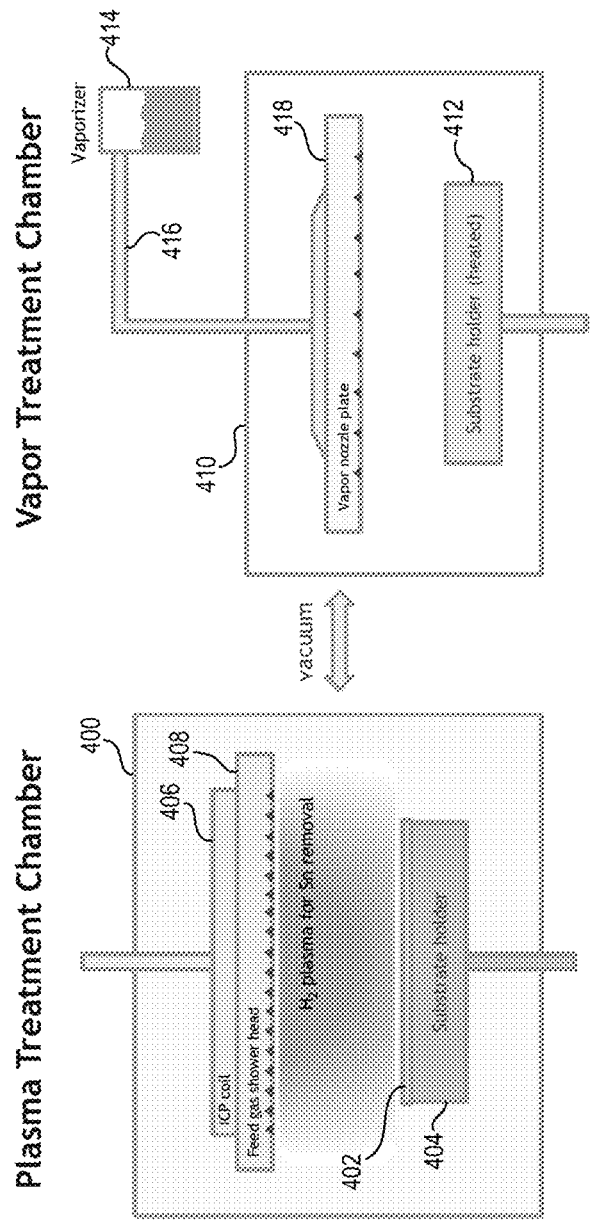

FIGS. 4A-4C illustrate performance of ALE process operations in a plasma treatment chamber 400 and a vapor treatment chamber 410, in accordance with implementations of the disclosure. With reference to FIG. 4A, the substrate 402 is shown atop a substrate holder 404 in a plasma treatment chamber 400. Following initiation of process gas flow through a feed gas shower head 408 and warm-up, an inductively coupled plasma (ICP) is generated by applying power to the ICP coil 406. In various implementations, fluorine plasma type 1 or 2 or other types can be used for fluorination. It will be appreciated that a fluorine plasma can be generated from various flurorine-containing precursors, such as $CF_4$, $NF_3$, $SF_6$, $CHF_3$, $C_2H_2F_4$, $F_2$, $SiF_4$, etc. In some implementations, the substrate holder 404 is heated to a temperature of about 100° C. In some implementations, the fluorination operation is performed at a pressure of approximately 20 mTorr. Following the plasma exposure, a pump-out is performed to remove process gases from the chamber.

With reference to FIG. 4B, after completion of the fluorination operations in the plasma treatment chamber 400, the substrate 402 is moved, without breaking vacuum, to a vapor treatment chamber 410 for performance of a ligand exchange operation. Following a warm-up, a vapor treatment is applied by flowing a vapor over the substrate as it is disposed atop the substrate holder 412. For example, Sn(acac)2 vapor can be generated by a vaporizer 414 flowed through a heated vapor line 416 and distributed over the substrate via a vapor nozzle plate 418. The vapor treatment does not entail generation of a plasma. In some implementations, Sn(acac)2 vapor for ligand exchange is applied. In some implementations, the substrate holder 412 is heated to a temperature of approximately 200° C. In some implementations, the chamber pressure is maintained at approximately 20 mTorr to 120 mTorr. In some implementations, the vapor treatment is applied for approximately one second to approximately 15 seconds. Following application of the vapor treatment, a pump-out is performed to remove process gases from the vapor treatment chamber 410.

With reference to FIG. 4C, after completion of the ligand exchange operation, the substrate 402 is moved, without breaking vacuum, to a plasma treatment chamber, which may be the same plasma treatment chamber 400 as that utilized for the fluorination operation, or a different plasma treatment chamber. A hydrogen plasma treatment is performed in order to remove residual tin from the substrate surface. $H_2$ gas is flowed through the feed gas shower head 408 and power is applied to the ICP coil 406 to generate the $H_2$ plasma. In some implementations, 500 W ICP power is applied. In some implementations, the substrate holder 404 is heated to a temperature of approximately 100° C. In some implementations, the hydrogen plasma treatment is performed at a chamber pressure of approximately 20 mTorr. In some implementations, the hydrogen plasma treatment is performed for a duration of approximately 5 to 45 seconds. Following the plasma exposure, a pump-out is performed to remove process gases from the plasma treatment chamber.

Though in the illustrated implementation, separate chambers for plasma treatment and vapor treatment have been shown, it will be appreciated by those skilled in the art that in other implementations, a single chamber can be used for plasma and vapor treatments. Such a system can have appropriate valves to enable switching between different process gases (e.g. individual valves controlling the introduction of each process gas into the chamber). Purge or pump-out operations can be performed following each of the fluorination, vapor treatment, and hydrogen plasma treatments.

Figure 5:
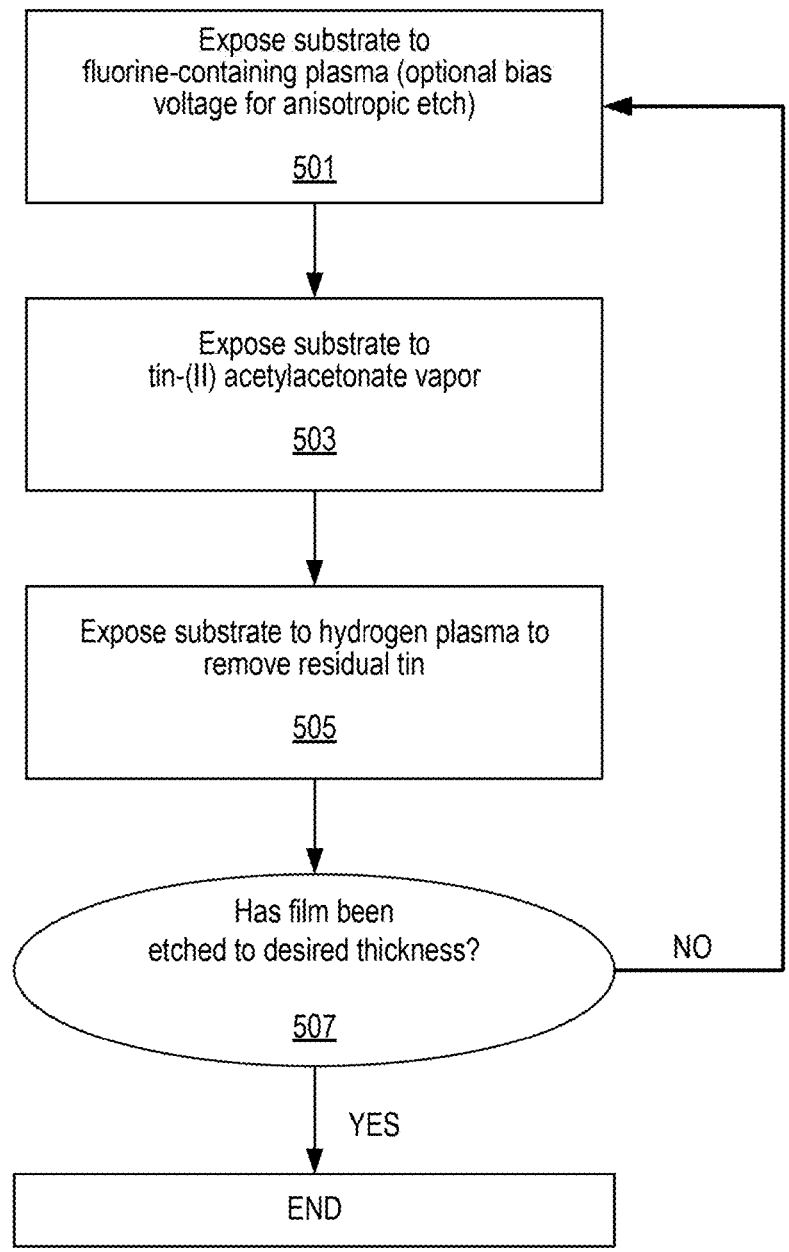
FIG. 5 illustrates a process flow diagram for a method performed in accordance with disclosed implementations.

A process flow diagram for a method performed in accordance with disclosed implementations is provided in FIG. 5. During operations 501-507, an inert gas such as an argon gas may be continuously flowed in the background as a carrier gas.

In operation 501, a substrate including a material to be etched is exposed to a fluorine-containing plasma to modify the surface of the substrate.

The fluorine-containing plasma may be generated by introducing a fluorine-containing gas and igniting a plasma. For example, in some implementations, the fluorine-containing gas may be carbon tetrafluoride ($CF_4$), nitrogen trifluoride ($NF_3$), sulfur hexafluoride ($SF_6$), fluorine ($F_2$), or any fluorine-containing gas. In various implementations, $CF_4$ may be introduced with $O_2$ to generate an abundance of fluorine ions in the plasma to etch the substrate. In some implementations, about 35% of the total flow of gases to the chamber to generate the fluorine-containing plasma is $O_2$ gas. Other fluorine-containing gases that include carbon may be used in some implementations when introduced with another gas to inhibit the formation of a carbide. For example, other fluorine-containing gases may have the formula $C_xH_yF_z$, where x may be any integer greater than or equal to 1, y may be any integer greater than or equal to 0, and z may be any integer greater than or equal to 1. Examples include fluoroform ($CHF_3$) and difluoromethane ($CH_2F_2$). In some implementations, the fluorine-containing gas may be generated by vaporizing a fluorine-containing liquid.

In some implementations, the substrate is not patterned. In other implementations, the substrate may be patterned. The substrate may include a transistor structure which may include an additional gate layer such as a blocking oxide or an etch stop layer. For example, the substrate may include an aluminum oxide layer over a fin of a FinFET transistor. In some implementations, the substrate may include a 3D NAND structure with a metal oxide etch stop layer at the bottom of trenches formed in the structure such that the metal oxide etch stop layer is the material to be etched. In various implementations, features on the substrate may have an aspect ratio between about 1.5:1 and about 5:1. In some implementations, features may have aspect ratios up to about 10:1.

The plasma in operation 501 may be generated in situ or may be a remote plasma. In many implementations, the plasma is generated in situ to generate an inductively coupled plasma.

However, in other implementations, a capacitively coupled plasma (CCP) can be employed. In such implementations, the CCP reactor can be configured to enable a low-bias mode, to provide for isotropic ALE. For example, such a CCP reactor may employ an RF electrode on top of the reactor, a substrate holder configured to have a floating ground, and run at a relatively high RF frequency setting, e.g. 60 MHz.

In various implementations, the substrate includes a metal oxide, metal nitride, metal phosphide, metal sulfide, metal arsenide, pure metal or any other metal compound layer to be etched. Examples include aluminum oxide ($Al_2O_3$) and hafnium oxide. Note that in many implementations, silicon-containing material (e.g., silicon oxide, silicon nitride, silicon carbide, silicon, etc.) may not be etched using disclosed implementations, which contributes to achieving etch selectivity particularly when etching a material such as a sacrificial gate oxide layer over a fin on a FinFET transistor structure. Although it will be understood that disclosed implementations may be used to etch various materials, FIG. 5 will be described with respect to etching aluminum oxide.

In some implementations, operation 501 may be performed without applying a RF bias to allow isotropic modification of the substrate surface. Note that although some disclosed implementations may be used to perform isotropic etch, in other implementations, an anisotropic etching process may also be performed by applying a bias during operation 501. The method described herein with respect to FIG. 5 can thus be configured for isotropically or anisotropically etching aluminum oxide.

Without being bound by a particular theory, during operation 501, a metal oxide surface such as an aluminum oxide surface, may be fluorinated by the fluorine-containing plasma, isotropically or anisotropically, to modify the surface of the aluminum oxide to form aluminum fluoride (e.g., $AlF_3$). One or a few monolayers of the aluminum oxide surface may be modified to form aluminum fluoride. The modification operation may be limited by the depth of diffusion/penetration of fluorine ions. Under the influence of a bias, the penetration/diffusion depth of the fluorine ions becomes deeper (along the bias axis) and also more anisotropic. The substrate may be exposed to the fluorine-containing plasma at a chamber pressure between about 10 mTorr and about 100 mTorr, such as at about 20 mTorr for a duration less than about 15 seconds but greater than 0 seconds.

In another implementation, a thermal fluorination operation is performed, as opposed to the plasma-driven process described above. That is, the substrate is exposed to a fluorine-containing gas (e.g. $NF_3$, etc.) at a sufficient temperature to induce surface fluorination, without the need for generating a plasma.

Note that in some implementations, after performing operation 501, the chamber housing the substrate may not be purged. In some implementations, the substrate may be purged.

In operation 503, the substrate is exposed to tin-(II) acetylacetonate ($Sn(acac)_2$) vapor. In various implementations, $Sn(acac)_2$ may be vaporized in an external vaporizer prior to delivering the vapor to the substrate.

Without being bound by a particular theory, it is believed that when the modified $AlF_3$ surface is exposed to $Sn(acac)_2$ vapor, a ligand exchange reaction occurs such that one acac ligand on $Sn(acac)_2$ replaces one fluorine atom on a $AlF_3$ molecule, forming $AlF_2(acac)$. Additional $Sn(acac)_2$ and/or $Sn(acac)$ may then react with $AlF_2(acac)$ again twice to replace the second and third fluorine atoms with (acac), resulting in $Al(acac)_3$. It is believed that as the acac ligands are substituted for the fluorine atoms, the $Al(acac)_x$ species becomes increasingly volatile, enabling it to be etched from the substrate. The reaction is self-limiting, and it is believed that some tin, tin fluoride, tin oxide, and $Sn(acac)_2$ may begin to build up on the surface of the material to be etched, thus blocking further etching of any modified underlayers of $AlF_3$.

In some implementations, operations 501 and 503 may be performed in the same chamber. In such implementations, a rapid temperature change between the ligand exchange step and the $H_2$ plasma flash is achieved, as the ligand exchange reaction needs to be above approximately 190 C, whereas the $H_2$ plasma flash must be below approximately 150 C or else etching of the $Al_2O_3$ with the $H_2$ plasma will occur. In operation 503, the plasma is turned off and the fluorine-containing gas flow may be turned off prior to turning on the vapor flow. In some implementations, the chamber is not purged prior to operation 503.

In some implementations, operations 501 and 503 may be performed in separate chambers of the same apparatus. An apparatus having multiple chambers for performing ALE operations can be provided, in accordance with implementations of the disclosure. In various implementations, the substrate may be shuttled or moved between a first chamber for exposing to a fluorine-containing plasma in operation 501 to a second chamber for exposing to $Sn(acac)_2$ vapor in operation 503. In some implementations, the second chamber is a vapor deposition chamber. In some implementations, the second chamber is a modified chamber that does not include a plasma source. Note that movement or shuttling of the substrate between chambers may be performed without breaking vacuum.

In alternative implementations, the substrate may be exposed to another chemical in vapor phase that is selective to the metal fluoride but does not react with the metal oxide. The chemical may include one or more ligands that, when reacted with a metal fluoride, generates a volatile compound including the metal bonded to the ligand (e.g. $Sn(acac)_2$).

In some implementations, operation 503 may be performed for a duration of about 1 second with the temperature of the wafer holder or pedestal holding the wafer set to a temperature of about 200° C. In various implementations, the chamber pressure at the end of the exposure to the $Sn(acac)_2$ vapor may be about 20 mTorr.

In operation 505, the substrate may be exposed to a plasma treatment (e.g. a hydrogen plasma). Without being bound by a particular theory, it is believed that operation 505 is performed to volatilize tin, tin fluoride or tin oxide buildup on the surface of the substrate, which can accumulate from performing operation 503. Exposing the substrate to hydrogen may form tin hydrates which are volatile at the chosen substrate temperature, which may then be pumped from the processing chamber. The substrate may be exposed to the plasma treatment for a duration greater than 0 seconds and less than 5 seconds. The duration of plasma exposure may depend on the amount of tin on the surface. For example, in some implementations, the amount of tin may be determined by evaluating tin lines in an emission spectrum. In some implementations, the plasma may be turned off when the tin lines in an emission spectrum disappear. In some implementations, the substrate is exposed to the plasma for about 5 seconds. In some implementations, the substrate is exposed to the plasma for a duration greater than about 5 seconds. In various implementations, the plasma treatment may include introducing a hydrogen gas and igniting a plasma. Operation 505 may be performed in the same chamber as in operation 501 and/or 503. Note that although operation 505 may be performed by exposing the substrate to hydrogen plasma, in some implementations a different chemistry may be used to remove tin or tin oxide buildup on the surface of the material to be etched. For example, in some implementations, ammonia ($NH_3$) plasma may be used.

In some implementations, operation 505 may be performed in a separate chamber. For example, in some implementations, the substrate may be moved or shuttled to the first station/chamber where operation 501 was performed, or may be moved or shuttled to a third station/chamber to perform operation 505. Note that movement or shuttling of the substrate between chambers may be performed without breaking vacuum.

In operation 507, it is determined whether the amount etched is sufficient to achieve the desired amount to be etched. If the desired remaining thickness has not yet been achieved, operations 501-505 may be optionally repeated. Note that in some implementations, operation 505 may only be performed every n cycles of performing operations 501 and 503, where n is an integer greater than or equal to 1. Where n is 1, operation 505 is performed in every cycle. In various implementations, operation 505 is performed in every cycle. In another example, operation 505 may be performed every 2 cycles of performing operations 501 and 503 (where n is 2) such that the following operations may be performed to etch a substrate: (1) exposure to fluorine-containing plasma, (2) exposure to $Sn(acac)_2$ vapor, (3) exposure to fluorine-containing plasma, (4) exposure to $Sn(acac)_2$ vapor, (5) exposure to hydrogen plasma, and (6) repeat (1)-(5).

In accordance with some implementations of the disclosure, isotropic atomic layer etch utilizes a low-bias plasma during the modification step. When etching metal oxides such as $Al_2O_3$, this involves a zero-bias fluorine plasma to form aluminum-fluoride at the surface of the oxide film. This step is self-limiting to a few monolayers as the data described below indicate.

During the following vapor removal step, $Sn(acac)_2$ reacts with the fluorinated top surface of the film via the ligand exchange mechanism and etches away the fluorinated layer. As the vapor treatment brings no directional energy such as ion energy from a plasma sheath to the wafer, the vapor step etches the metal fluoride isotropically. The overall sequence of reactions can be summarized in the following way: (1) Create a fluorinated shallow surface layer of ~1.5 nm in a low bias fluorine plasma. The plasma may be based on $CF_4$ or $NF_3$, for example. (2) Without plasma, apply $Sn(acac)_2$ vapor while the substrate is heated to an elevated temperature (for example, 200 C) to perform a ligand exchange reaction between the fluorine and the acac ligands. (3) Pump away volatile reaction by-products. (4) Apply a brief hydrogen plasma flash to the surface of the substrate to remove non-volatile tin by-products from the substrate surface. (5) Return to step (1) and repeat.

Anisotropy can be introduced to the etch process in a controlled fashion by turning on plasma bias during the plasma fluorination step in a controlled manner. Data have been obtained showing that the depth of fluorination can be controlled via bias energy. Fluorine ions will advance deeper into the metal oxide film before they can be stopped if their incipient ion energy acquired during the acceleration in the plasma sheath is greater.

To better understand fluorination, $Al_2O_3$ films were exposed to various fluorination conditions after which a set of characterization techniques were employed to understand changes to the film. Angle resolved x-ray photoelectron spectroscopy (ARXPS) was used to measure fluorination depth and total material loss.

Figure 6:
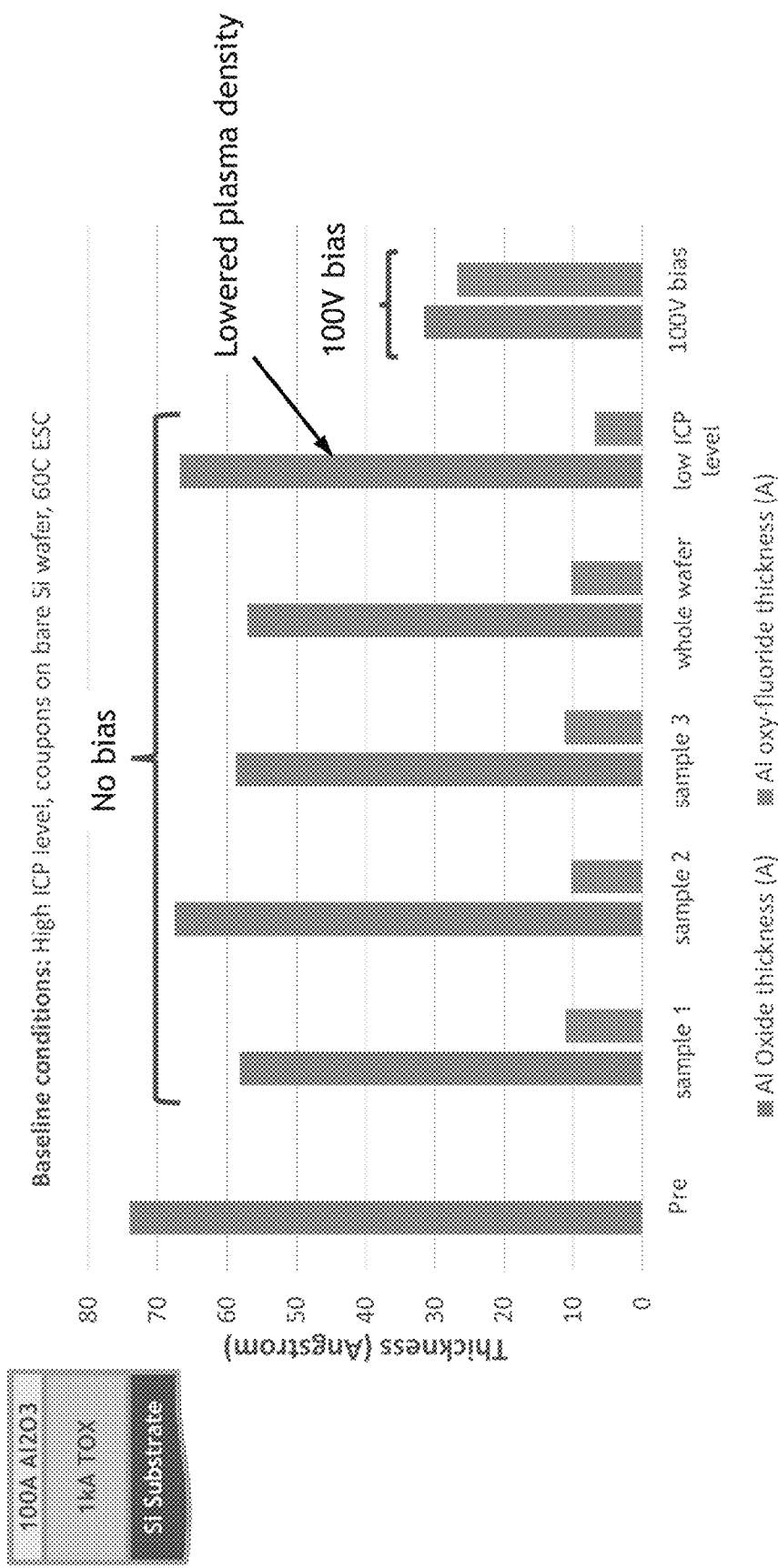
FIG. 6 illustrates a graph showing Al Oxide thickness and Al oxy-fluoride thickness under various conditions, using ARXPS characterization of the surface following single fluorination, in accordance with implementations of the disclosure.

FIG. 6 illustrates a graph showing aluminum oxide thickness and aluminum oxy-fluoride thickness under various conditions, using ARXPS characterization of the surface following single fluorination, in accordance with implementations of the disclosure. As indicated, fluorination depth was shown to be dependent on plasma density and ion energy. However, cathode bias (influencing ion energy) demonstrated the highest impact on fluorination depth, to a significantly greater extent than plasma density.

Figure 7:
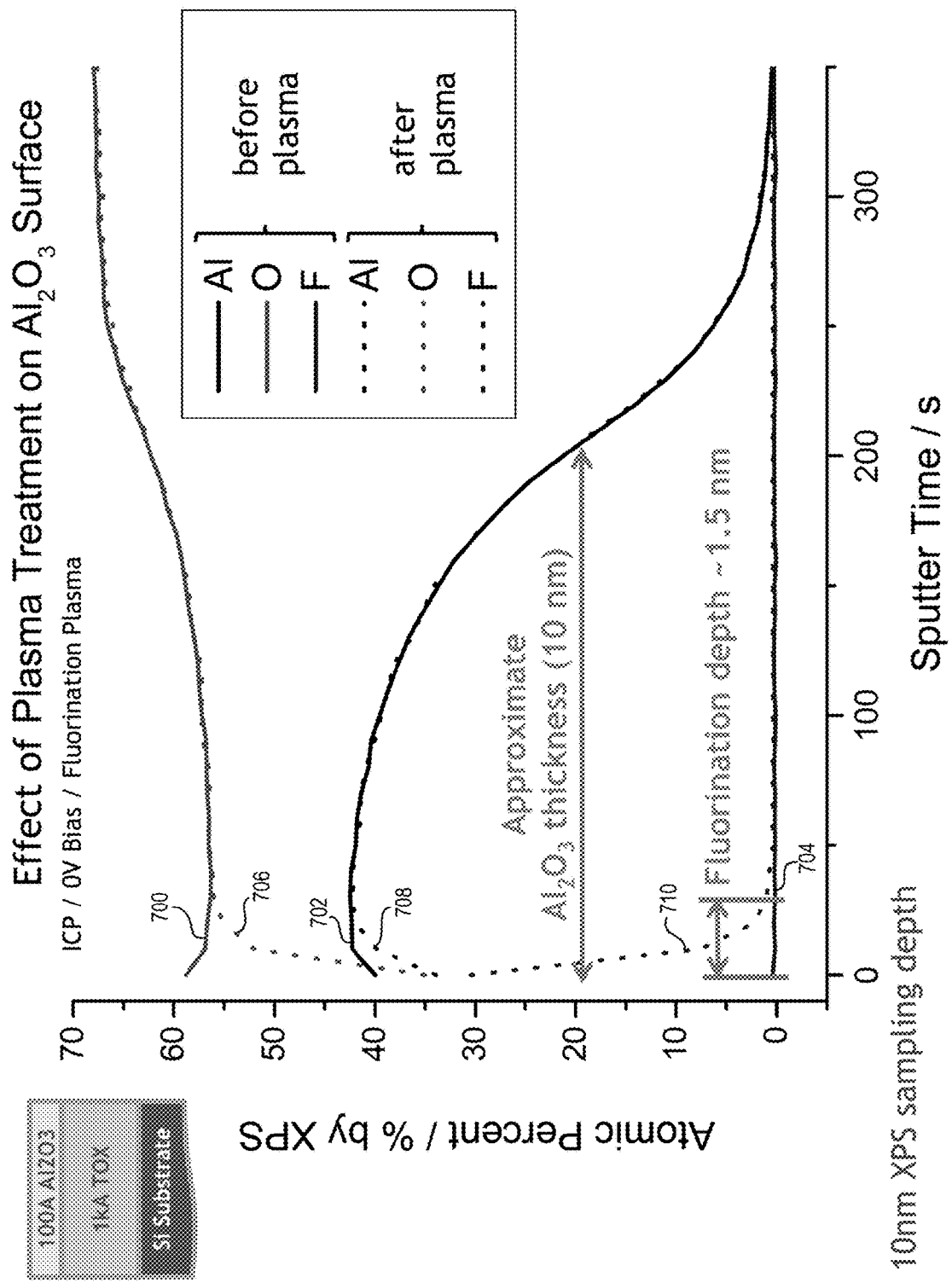
FIG. 7 illustrates surface fluorination depth using zero-bias plasma, in accordance with implementations of the disclosure.

FIG. 7 illustrates surface fluorination depth using zero-bias plasma, in accordance with implementations of the disclosure. The fluorination depth after plasma treatment was probed via depth-resolved XPS. In agreement with the results shown at FIG. 6, the fluorination depth was found to be limited down to approximately 1.5 nm. More specifically, a sample having a 100 angstrom surface thickness of $Al_2O_3$ over a silicon dioxide (thermal oxide) layer (1000 angstrom thickness) over a silicon substrate was profiled. In the illustrated graph, measured atomic percentages for the elements aluminum, oxygen, and fluorine as a function of sputter time (seconds) are shown. Measurements are shown both before and after the application of a fluorination plasma under a zero bias condition.

Before the application of the fluorination plasma, the atomic percentage of oxygen is shown by curve 700; the atomic percentage of aluminum is shown by curve 702; and the atomic percentage of fluorine is shown by curve 704. As indicated, the atomic percentage of aluminum drops off at around 200 seconds, which corresponds to the complete sputtering of the 100 angstrom (10 nm) thickness of the aluminum oxide layer. Thus, approximately 1 nm of thickness is sputtered every 20 seconds. The atomic percentage of oxygen, shown by curve 700, increases after about 200 seconds, as the sputter reaches the silicon dioxide layer. The atomic percentage of fluorine, shown by curve 704, is zero throughout, as the fluorination plasma has yet to be applied.

After the application of the fluorination plasma, the atomic percentage of oxygen is shown by curve 706; the atomic percentage of aluminum is shown by curve 708; and the atomic percentage of fluorine is shown by curve 710. As can be seen, the atomic percentage of fluorine drops to near zero within about 30 seconds of sputter time, which corresponds to a depth of about 15 angstroms (1.5 nanometers). Thus, with zero bias, the fluorination plasma achieved a fluorine diffusion depth of about 15 angstroms.

Figures 8A, 8B, 8C:
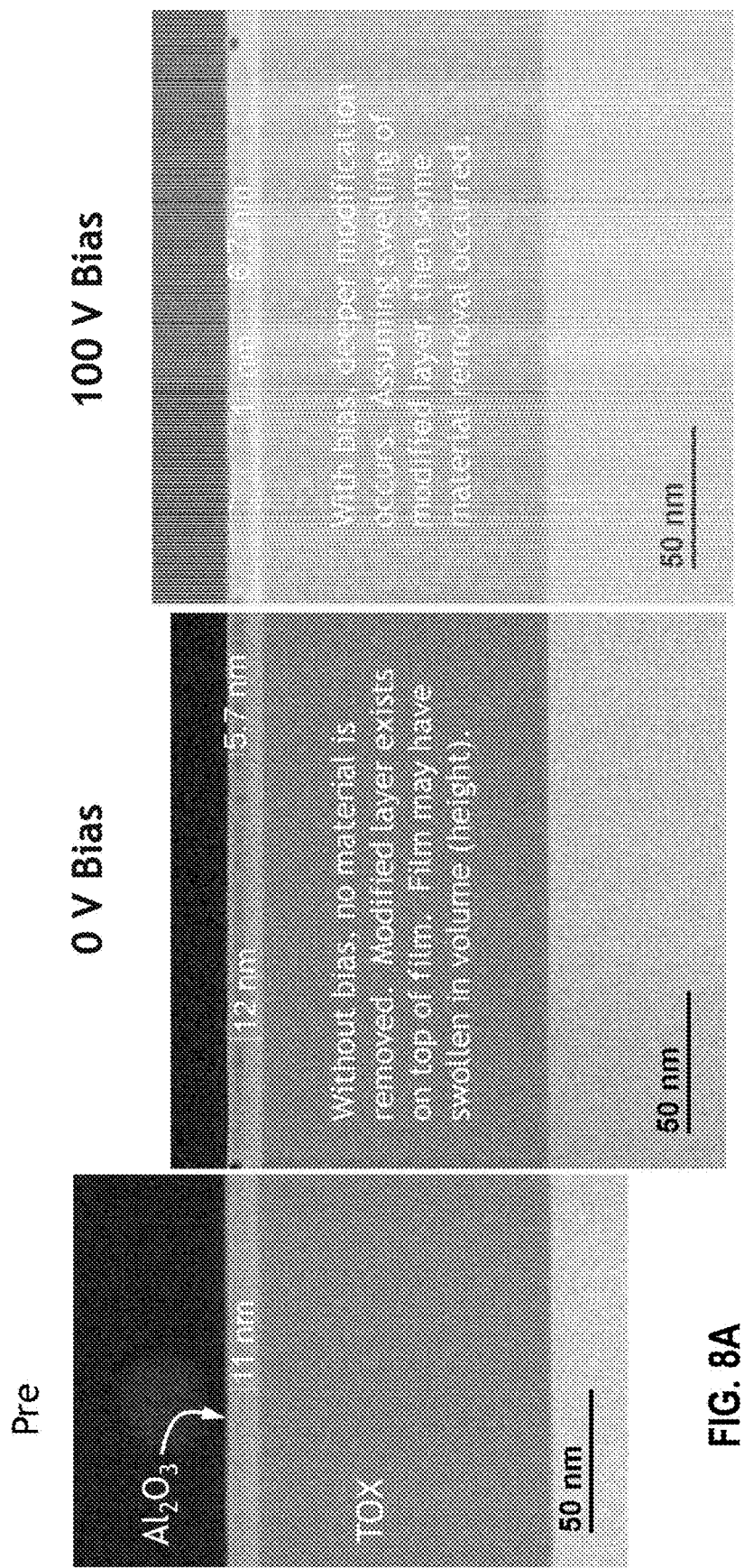
FIGS. 8A-E are STEM images of a cross section of a fluorinated film, in accordance with implementations of the disclosure.
Figures 8D, 8E:
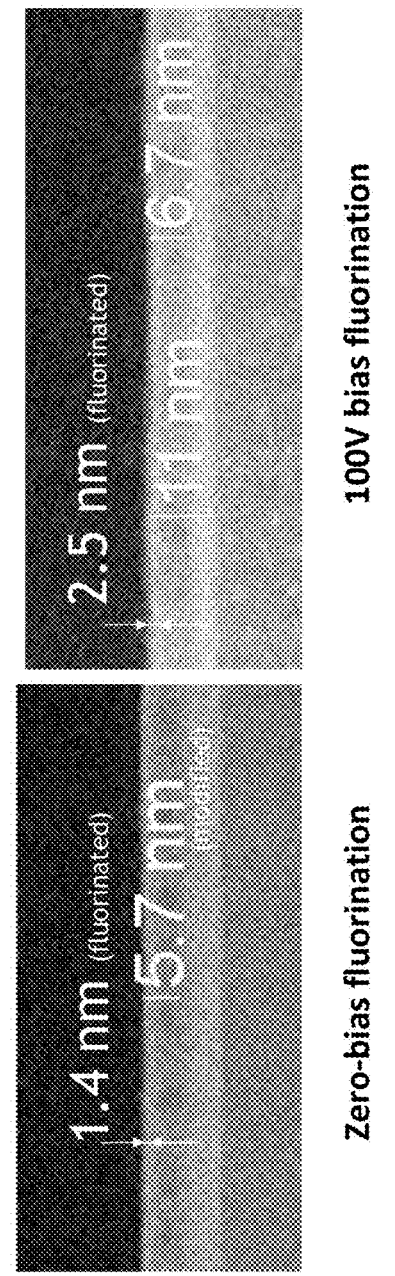

FIGS. 8A-E are STEM images of a cross section of a fluorinated film, in accordance with implementations of the disclosure. FIG. 8A shows the pre-fluorination cross-section, including a surface layer of aluminum oxide having a thickness of about 11 nanometers (nm), over a layer of thermal silicon dioxide. FIG. 8B shows the result of fluorination without bias. FIG. 8D shows a close-up view of a portion of this result.

FIG. 8C shows the result of fluorination with a 100V bias. FIG. 8E shows a close-up view of a portion of this result.

As indicated by these images, the modified depth (indicated by darker grey) was 5.7 nm without bias, and 6.7 nm with 100V bias. The fluorinated depth (indicated by light grey top) was 1.4 nm without bias, and 2.5 nm with 100V bias. The 'c' lattice constant of $Al_2O_3$ is ~1.3 nm. As can be seen from the images, the fluorinated depth has increased as a result of the application of a 100V bias.

FIGS. 9A and 9B illustrate film loss following a 30 second fluorine plasma exposure versus a 300 second fluorine plasma exposure, respectively, in accordance with implementations of the disclosure. As shown, the 300 second fluorine plasma exposure did not produce additional film loss of significance beyond that of the 30 second fluorine plasma exposure.

Figure 10:
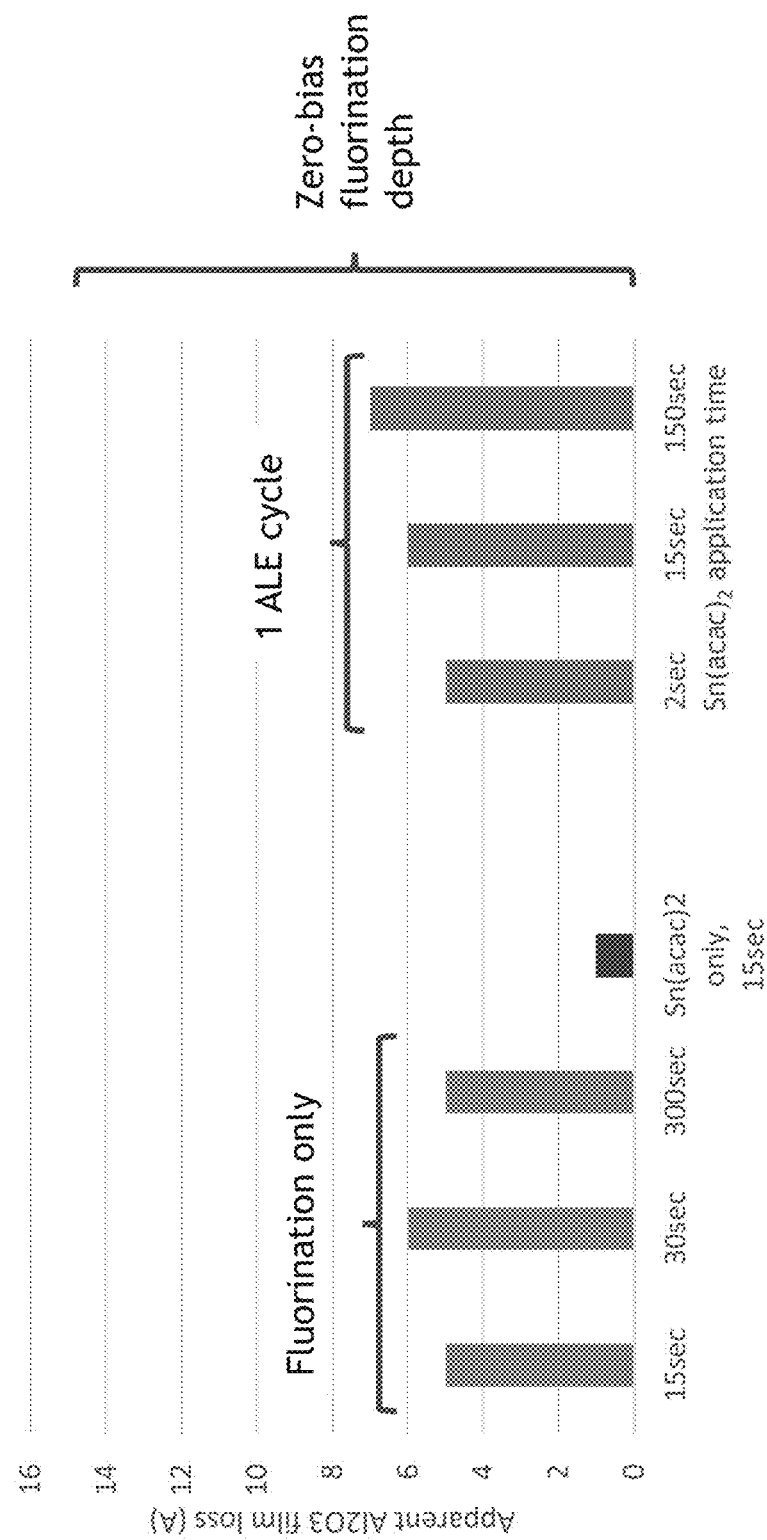
FIG. 10 is a graph showing SE characterization of film loss, demonstrating the self-limiting nature of the fluorination and Sn(acac)2 exposure, in accordance with implementations of the disclosure.

FIG. 10 is a graph showing Spectral Ellipsometry (SE) characterization of film loss, demonstrating the self-limiting nature of the fluorination and $Sn(acac)_2$ exposure, in accordance with implementations of the disclosure.

As shown, the zero-bias fluorination process is self-limiting. The ~5 Å loss is likely due to refractive index change during fluorination.

Additionally, the results show that the material removed in one ALE cycle may weakly depend on $Sn(acac)_2$ application time. However, there is some material left on the surface which limits the ability to etch to the full extent of the fluorination depth (~15 Å).

As noted, the fluorinated depth increases with the application of a bias. Accordingly, during the $Sn(acac)_2$ vapor step more metal fluoride will be removed from the film having a bias applied during the fluorination step (e.g. 100V) than in the zero-bias case. As the fluorination depth only increases on surfaces parallel to the plasma sheath edge but not on those perpendicular to it, an anisotropy in the following removal step can be achieved. That is, more material will be removed from horizontal than from vertical surfaces.

Figure 11:
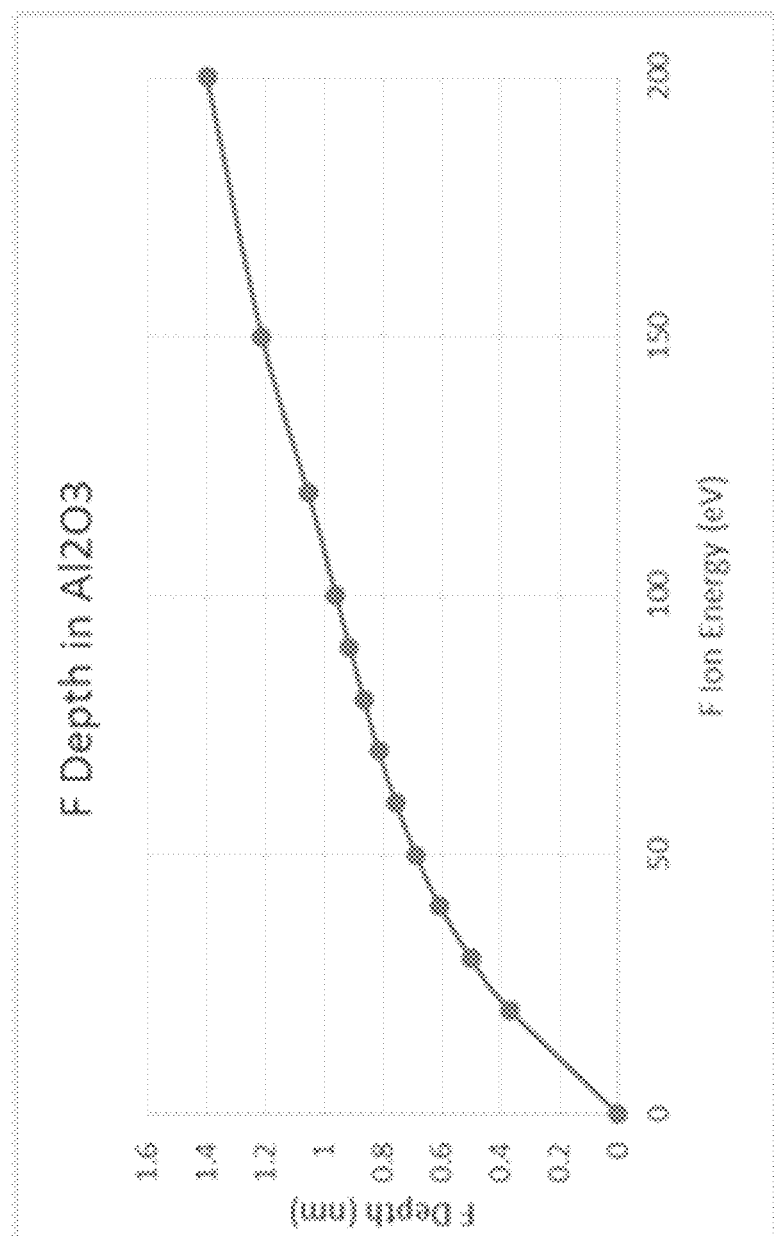
FIG. 11 is a graph illustrating calculated fluorination depth as a function of fluorine ion energy, in accordance with implementations of the disclosure.

FIG. 11 is a graph illustrating calculated fluorination depth as a function of fluorine ion energy, in accordance with implementations of the disclosure. As shown, increased ion energy results in increased fluorination depth. For example, to achieve greater than 1 nm fluorination depth would require ion energy greater than 100 eV. Thus, the amount of anisotropy of the ALE process increases with increasing ion energy during the fluorination step.

As noted above, the ligand exchange operation may not fully consume the fluorinated portion of the substrate in a single operation, as it may be self-limited due to residue build-up, and a hydrogen plasma may be applied to remove the residue. Therefore, in some implementations, ligand exchange and hydrogen plasma operations can be repeated multiple times per each fluorination operation.

Figure 12:
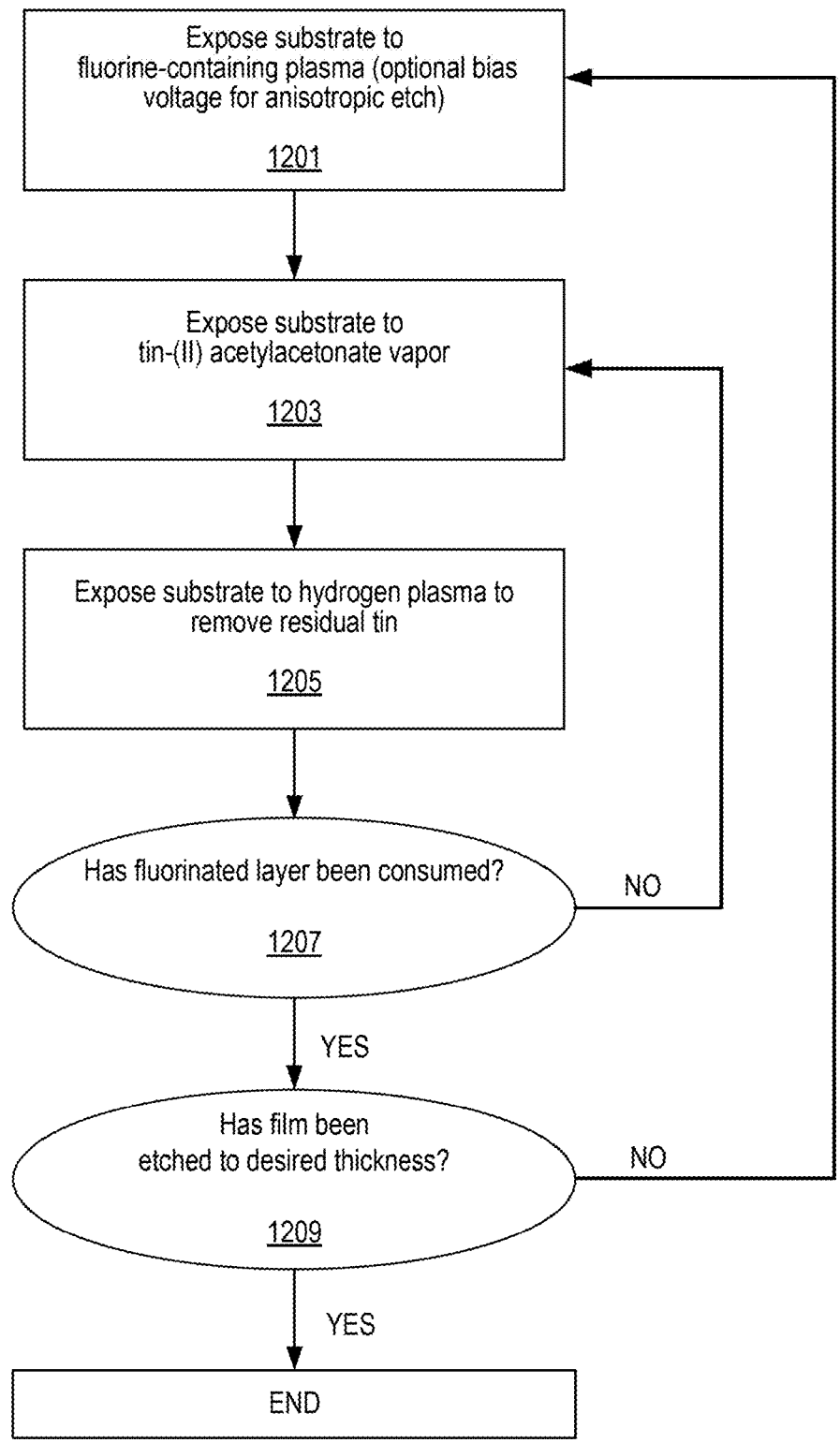
FIG. 12 illustrates a method for performing ALE using multiple ligand exchange and plasma cleaning operations per single surface modification operation, in accordance with implementations of the disclosure.

FIG. 12 illustrates a method for performing ALE using multiple ligand exchange and plasma cleaning operations per single surface modification operation, in accordance with implementations of the disclosure. The illustrated method is described with reference to fluorine-containing plasma for surface modification, $Sn(acac)_2$ for ligand exchange, and hydrogen plasma for residue removal. However, in various implementations, the method can be applied for any other set of specific chemistries for surface modification, ligand exchange, and residue removal.

At method operation 1201, using a fluorine plasma, a fluorinated surface layer is created, having a depth that is controlled by the magnitude of the bias voltage during the fluorine plasma exposure. In some implementations, the plasma may be generated using $CF_4$ or $NF_3$. It will be appreciated that the application of a bias voltage will not only increase the depth of fluorination, but also the anisotropy of the overall etch process, as the fluorination depth is increased through the application of the bias in a directional manner (normal to the substrate/wafer plane).

At method operation 1203, without plasma, $Sn(acac)_2$ vapor is applied while the substrate is heated to an elevated temperature (for example, 200 C) to perform a ligand exchange reaction between the fluorine and the acac ligands. It is noted that a single $Sn(acac)_2$ vapor application may only perform ligand exchange with the top layers of the fluorinated film, and therefore may not completely consume the entire fluorinated film. This may especially be true in the case where the fluorinated depth has been increased through the application of a bias voltage (as compared to a zero-bias fluorination plasma). Following the $Sn(acac)_2$ vapor application, volatile reaction by-products are pumped away. However, as noted, there may be a build-up of (non-volatile) tin-containing residues that remain on the surface, and which prevent further ligand-exchange reaction (and subsequent removal of material) from occurring during the $Sn(acac)_2$ vapor application.

Therefore, at method operation 1205, a brief hydrogen plasma flash is applied to the surface of the substrate to remove non-volatile tin by-products from the substrate surface.

As noted, the vapor application occurring at method operation 1203 may not have consumed the entire fluorinated surface layer. Hence, at method operation 1207, it is determined whether the fluorinated layer has been consumed by the ligand exchange. If not, then the method returns to operation 1203, to repeat the Sn(acac)2 and hydrogen plasma exposures until the fluorinated layer has been consumed. It will be appreciated that the number of cycles of method operations 1203 and 1205 required to entirely consume the fluorinated layer may be experimentally predetermined. Consequently, determining whether the fluorinated layer has been consumed at method operation 1207 may be defined by determining whether the predetermined number of cycles has been performed.

When the entire fluorinated layer has been consumed, or if a predetermined number of cycles necessary to fully consume the fluorinated layer has been performed, then at operation 1209, it is determined whether the film has been etched to the desired thickness. If not, then the method returns to operation 1201 to perform the surface fluorination.

The process (including method operation 1201, 1203, 1205, and 1207) is repeated until the film has been etched to the desired thickness, or until a predetermined number of cycles has been completed so as to achieve the desired thickness.

It will be appreciated that the foregoing process is faster than conventional ALE processes due to the performance of a single fluorination operation for multiple cycles of the $Sn(acac)_2$ exposure and hydrogen plasma exposure, as opposed to performing the fluorination operation with each instance of the $Sn(acac)_2$ and hydrogen plasma exposures. This can increase throughput for the ALE process. Furthermore, by reducing the number of fluorination operations, it is possible to preserve selectivity to a mask (e.g. silicon oxide mask) that may be present on the substrate surface, and which may be susceptible to degradation through multiple fluorination operations. By contrast, the ligand exchange is selective and does not affect the mask.

FIG. 13A conceptually illustrates a cross section of a substrate surface feature 1300, and performance of an anisotropic ALE process performed thereon, in accordance with implementations of the disclosure. The top surface of the substrate may include a mask 1302 to prevent other portions of the substrate from being etched. In the illustrated implementation, an isotropic ALE process is performed by performing ALE using a surface modification mechanism with zero bias. By performing the surface modification with zero bias, then the effect of the surface modification will be isotropic, producing conversion of available surface species to approximately uniform depth in an omnidirectional manner. As noted above, the surface modification may be diffusion limited to produce the depth of surface modification.

Because the surface modification has been isotropically performed, then that portion which has been modified is available for removal by the subsequent removal operation (e.g. via a ligand exchange mechanism). The result is an ALE process that is isotropic due to the lack of bias being applied during the surface modification operation. As noted above, in some implementations, a single surface modification may penetrate to a depth that is greater than that which can be removed by a single removal operation; and thus in some implementations, multiple removal and plasma clean operations are performed in succession in order to fully remove the entire portion that has been modified by the single surface modification operation.

The initial surfaces 1304 of the feature 1300 are shown, and successive cycles of the zero bias etch process isotropically deepen the surfaces 1304 of the feature 1300. The resulting surfaces of the feature 1300 following successive etch cycles are respectively shown by the surfaces 1306, 1308, 1310, and 1312. For example, following one etch cycle, the feature 1300 is isotropically etched so as to have surfaces 1306; following a second etch cycle, the feature 1300 is isotropically etched so as to have surfaces 1308; etc.

FIG. 13B conceptually illustrates a cross section of a substrate surface feature, and performance of an isotropic ALE process performed thereon, in accordance with implementations of the disclosure. The implementation of FIG. 13B is similar to that of FIG. 13A, except that during the surface modification operation, a bias voltage is applied, which introduces a degree of directionality to the surface modification operation. With increased bias power, the ions will be driven deeper in the downward vertical direction (orthogonal to the plane of the substrate surface) than the horizontal direction. The result is that surface modification will occur to greater depths in the downward vertical direction, and to reduced depths in the horizontal direction, as compared to a zero-bias surface modification. Then as the amount of material that has been converted by the surface modification operation determines that which is available for removal by the removal operation, then the result will be an anisotropic ALE exhibiting greater etch rate along the downward vertical direction and reduced etch rate along the horizontal direction, as compared to the zero-bias case.

With continued reference to FIG. 13B, the initial surfaces 1304 of the feature 1300 are again shown. However, in contrast to the zero bias etch, successive cycles of the biased etch process anisotropically deepen the surfaces 1304 of the feature 1300. The resulting surfaces of the feature 1300 following successive anisotropic etch cycles are respectively shown by the surfaces 1314, 1316, 1318, and 1320. For example, following one etch cycle, the feature 1300 is anisotropically etched so as to have surfaces 1314; following a second etch cycle, the feature 1300 is anisotropically etched so as to have surfaces 1316; etc. Additionally, in some implementations, the vertical surfaces can be coated with a protective polymer such that they are excluded from the ALE cycle all together. In this manner, one can avoid etching the vertical surfaces completely.

In sum, during the modification step in an ALE process, the depth of the modified layer (along the direction of the bias flux, or generally orthogonal to the substrate plane) can be controlled via the bias voltage applied during that step. The depth modification is generally limited to those surfaces parallel to the plasma sheath edge. Because of this, anisotropy can be introduced in a controlled way by controlling the amount of bias applied during plasma fluorination. That is, the relative etch rates in the vertical direction (orthogonal to the substrate plane) versus the horizontal direction (parallel to the substrate plane) can be tuned, with the ratio of vertical to horizontal etch increasing with increased bias power.

It will be appreciated that the bias power can be tuned for particular applications and ALE chemistries, and that there may be trade-offs related to the bias power. For example, as bias power is increased (e.g. by controlling bias voltage), ion implantation may occur to greater depths, producing greater surface modification depth, and increased anisotropy. However, as bias power is increased, more energy is imparted to the ions, which may also produce film loss due to reactive-ion etching and/or sputtering. Thus, in some implementations, bias power is tuned to provide a desired depth of surface modification, while also substantially avoiding film loss or tolerating an acceptable level of film loss for the given ALE application. One can control the bias to a level below the sputter threshold of the material that is being etched. That way, premature film loss can be minimized.

In some implementations, the degree of anisotropy can be increased via a polymerizing plasma step prior to fluorination to deposit a polymer liner inside the structure that is to be etched. This liner can be opened before or during the first part of the fluorination step on the bottom surface only (e.g.

by photoresist, photolithography, and ion etch) but would remain intact for sidewalls, thereby protecting them.

Figure 14A:
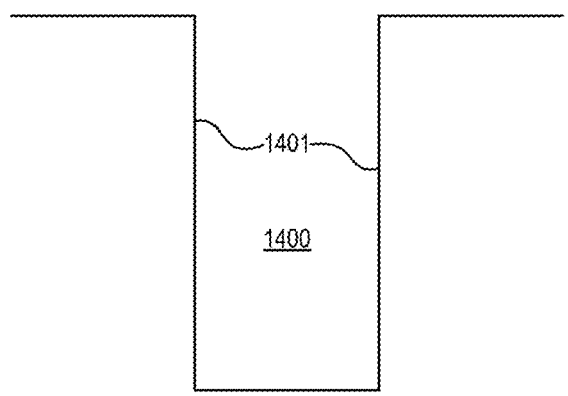
FIGS. 14A-D illustrate a process for providing increased anisotropy through deposition of a passivation layer, in accordance with implementations of the disclosure.
Figure 14B:
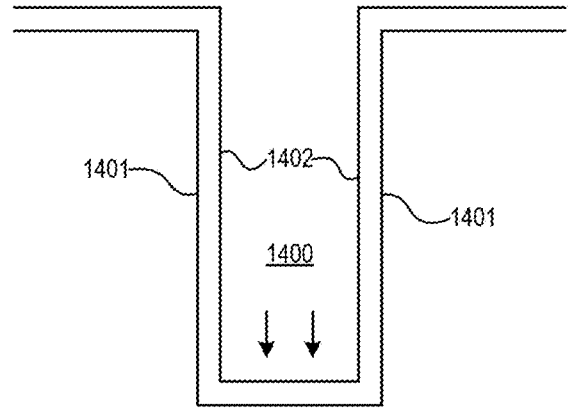

FIGS. 14A-D illustrate a process for providing increased anisotropy through deposition of a passivation layer, in accordance with implementations of the disclosure. FIG. 14A conceptually illustrates a cross section of a substrate surface feature 1400. A passivation layer 1402 is deposited in the feature, as shown at FIG. 14B. The passivation layer is a protective liner that protects the underlying surface from being etched during a subsequent ALE process. In various implementations, the passivation layer can consist of a polymer material, and inorganic material, or any other material capable of protecting feature surfaces from being etched during a subsequent ALE process. Furthermore, the passivation layer can be deposited by any suitable technique, including without limitation, CVD, ALD, etc.

Figure 14C:
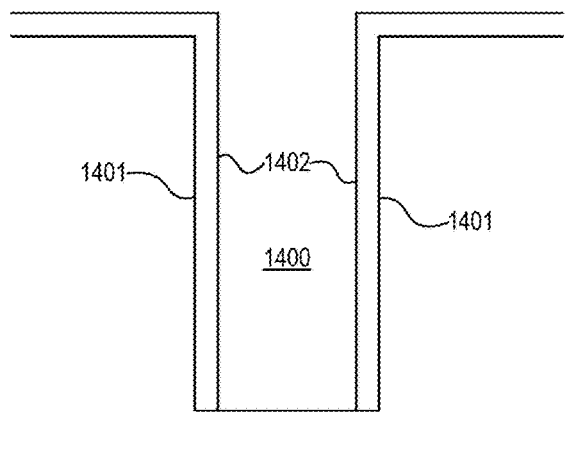
Figure 14D:
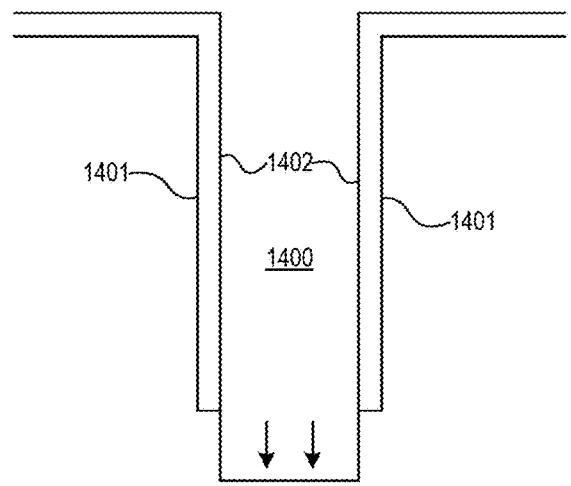

At FIG. 14C, the bottom of the passivation layer 1402 is opened, exposing the underlying substrate material for etching. At FIG. 14D, an anisotropic ALE process is carried out (using a bias voltage during the surface modification step). As shown, the bottom of the feature is etched, while the feature's sidewalls 1401 are protected by the passivation layer. In some implementations, the passivation layer 1402 is not etched by the ALE process. Whereas in other implementations, the passivation layer 1402 is configured to be partially or fully etched by the ALE process. In such implementations, the passivation layer 1402 acts to prevent or delay the onset of etching of the feature's sidewalls 1401, providing for increased anisotropy of the overall process.

Various implementations described herein may be performed in a plasma etch chamber such as the Kiyo, available from Lam Research Corporation in Fremont, Calif. In various implementations, a substrate may be shuttled between an etching chamber and a vapor chamber without breaking vacuum.

Figure 15:
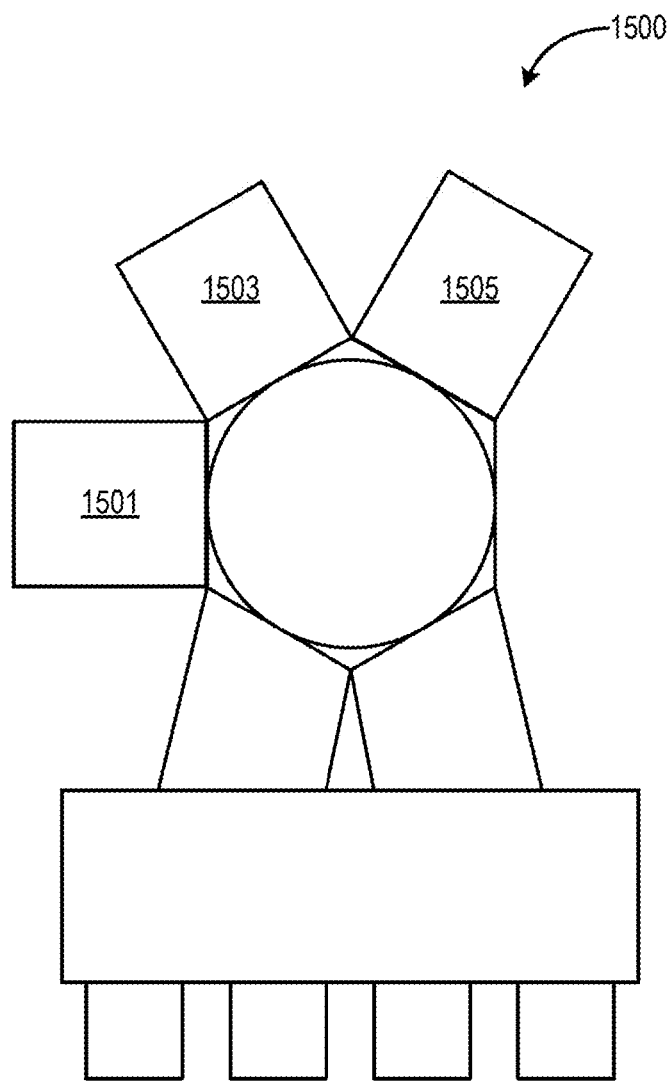
FIG. 15 illustrates a cluster tool 1500, in accordance with implementations of the disclosure.

Disclosed implementations may be performed in any suitable chamber or apparatus, such as the Kiyo® or Flex, both available from Lam Research Corporation of Fremont, Calif. In some implementations, disclosed implementations may be performed in a cluster tool, which may contain one or more stations. FIG. 15 illustrates a cluster tool 1500, in accordance with implementations of the disclosure. In various implementations, one station 1501 may include a module for etching while another station 1503 includes a module for exposing to vapor (e.g., a vapor chamber). In some implementations, a third station 1505 includes a module for exposing to a plasma.

Figure 16:
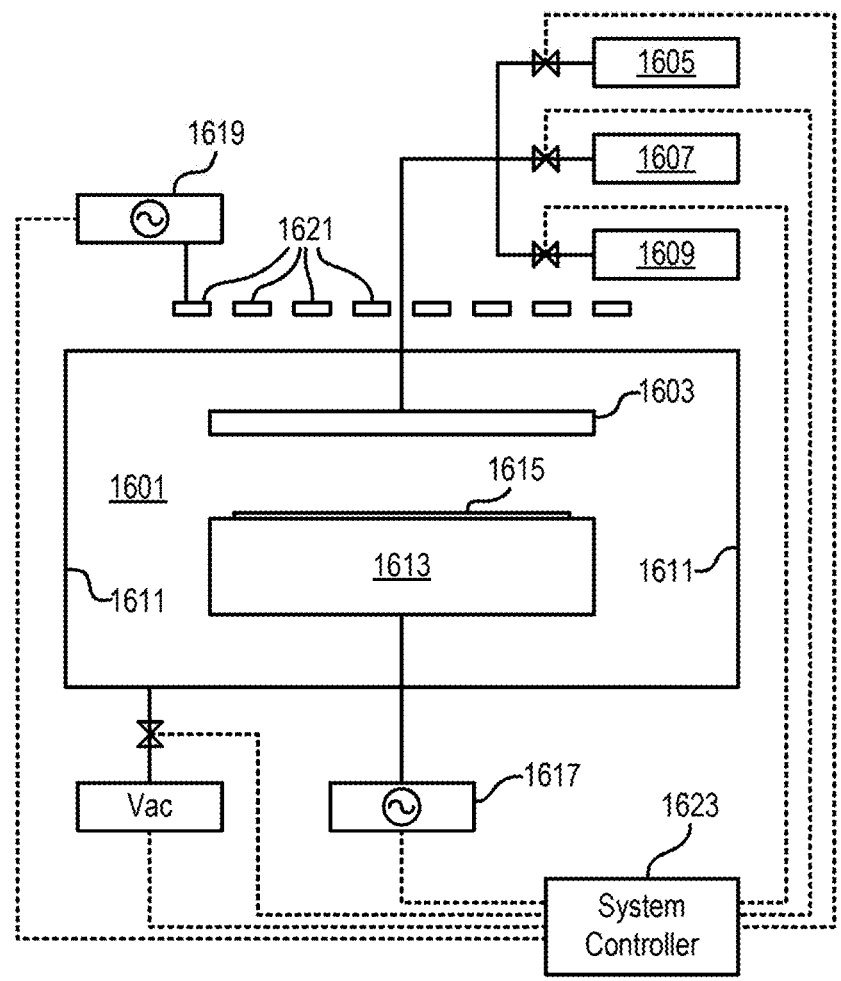
FIG. 16 illustrates an example etching chamber or apparatus, in accordance with implementations of the disclosure.

In some implementations, an inductively coupled plasma (ICP) reactor may be used. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference for the purpose of describing a suitable ICP reactor for implementation of the techniques described herein. Although ICP reactors are described herein, in some implementations, it should be understood that capacitively coupled plasma reactors may also be used. With reference to FIG. 16, an example etching chamber or apparatus may include a chamber 1601 having a showerhead or nozzle 1603 for distributing fluorine-containing gases (1605), hydrogen gas (1607), or Sn(acac)$_2$ vapor (1609) or other chemistries to the chamber 1601, chamber walls 1611, a chuck 1613 for holding a substrate or wafer 1615 to be processed which may include electrostatic electrodes for chucking and dechucking a wafer. The chuck 1613 is heated for thermal control, enabling heating of the substrate 1615. The chuck 1613 may be electrically charged using an RF power supply 1617 to provide a bias voltage in accordance with implementations of the disclosure (e.g. at a voltage in the range of approximately 20 to 200V, 13.56 Mhz). An RF power supply 1619 is configured to supply power (e.g. in the range of approximately 100 W to 3 kW, at 13.56 Mhz) to a coil 1621 to generate a plasma, and gas flow inlets for inletting gases as described herein. Though an ICP chamber is shown, in other implementations, a CCP chamber can be utilized. In various implementations, the chamber walls 1611 may be fluorine-resistant. For example, the chamber walls 1611 may be coated with silicon-containing material (such as silicon or silicon oxide) or carbon-containing material (such as diamond) or combinations thereof such that fluorine-containing gases and/or plasma may not etch the chamber walls 1611. Modification chemistry gases for chemisorption (such as fluorine-containing gases for generating fluorine-containing plasma) and/or vapor exposure (such as Sn(acac)$_2$) may be flowed to the chamber 1601. In some implementations, a hydrogen gas 1607 may be flowed to the chamber to generate a hydrogen plasma for removing tin, tin fluoride or tin oxide residues. In some implementations, the chamber walls are heated to support wall cleaning efficiency with a hydrogen plasma. In some implementations, an apparatus may include more than one chamber, each of which may be used to etch, deposit, or process substrates. The chamber or apparatus may include a system controller 1623 for controlling some or all of the operations of the chamber or apparatus such as modulating the chamber pressure, inert gas flow, plasma power, plasma frequency, reactive gas flow (e.g., fluorine-containing gas, Sn(acac)$_2$ vapor, etc.); bias power, temperature, vacuum settings; and other process conditions.

Figure 17:
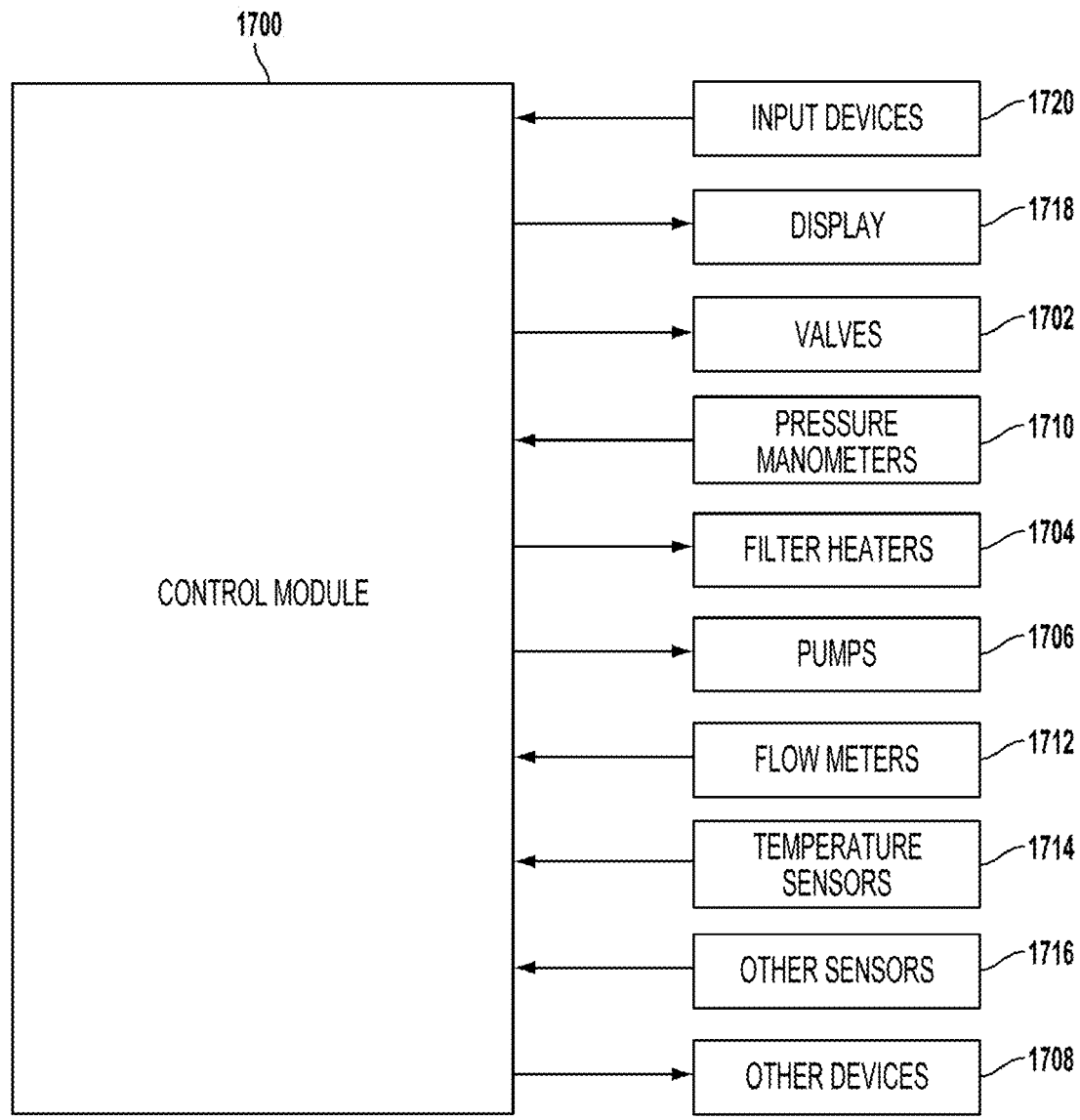
FIG. 17 shows a control module for controlling the systems described above, in accordance with implementations of the disclosure.

FIG. 17 shows a control module 1700 for controlling the systems described above, in accordance with implementations of the disclosure. For instance, the control module 1700 may include a processor, memory and one or more interfaces. The control module 1700 may be employed to control devices in the system based in part on sensed values. For example only, the control module 1700 may control one or more of valves 1702, filter heaters 1704, pumps 1706, and other devices 1708 based on the sensed values and other control parameters. The control module 1700 receives the sensed values from, for example only, pressure manometers 1710, flow meters 1712, temperature sensors 1714, and/or other sensors 1716. The control module 1700 may also be employed to control process conditions during reactant delivery and plasma processing. The control module 1700 will typically include one or more memory devices and one or more processors.

The control module 1700 may control activities of the reactant delivery system and plasma processing apparatus. The control module 1700 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 1700 may also monitor the pressure differential and automatically switch vapor reactant delivery from one or more paths to one or more other paths. Other computer programs stored on memory devices associated with the control module 1700 may be employed in some implementations.

Typically there will be a user interface associated with the control module 1700. The user interface may include a display 1718 (e.g. a display screen and/or graphical software displays of the apparatus and/or process conditions), and user input devices 1720 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing implementations have been described in some detail for purposes of clarity of understanding, it will be apparent that certain changes and modifications may be practiced within the scope of the disclosed implementations. It should be noted that there are many alternative ways of implementing the processes, systems, and apparatus of the present implementations. Accordingly, the present implementations are to be considered as illustrative and not restrictive, and the implementations are not to be limited to the details given herein.

What is claimed is:

1. A method for performing atomic layer etching (ALE) on a substrate, comprising:
    performing a surface modification operation on a substrate surface, the surface modification operation configured to convert at least one monolayer of the substrate surface to a modified layer, wherein a bias voltage is applied during the surface modification operation, the bias voltage configured to control a depth of the substrate surface that is converted by the surface modification operation;
    performing a removal operation on the substrate surface, the removal operation configured to remove at least a portion of the modified layer from the substrate surface, wherein removing the portion of the modified layer includes applying thermal energy to effect desorption of the portion of the modified layer.

2. The method of claim 1, wherein removing the portion of the modified layer includes a ligand exchange reaction.

3. The method of claim 2, wherein the thermal energy is applied simultaneously with the ligand exchange reaction.

4. The method of claim 2, wherein the thermal energy is applied after the ligand exchange reaction.

5. The method of claim 1, wherein the surface modification operation is configured to diffuse ions into the substrate surface to the depth as controlled by the bias voltage.

6. The method of claim 1, wherein the bias voltage is applied during part of the surface modification operation, the part during which the bias voltage is applied to increase an amount of the depth in a vertical direction that increases anisotropy of the ALE, and a portion during which the bias voltage is not applied to increase the depth in a non-vertical direction that increases isotropy of the ALE.

7. The method of claim 1, wherein the bias voltage does not exceed approximately 100 V.

8. The method of claim 1, wherein performing the surface modification operation includes exposing the substrate surface to a plasma, wherein the exposure to the plasma is configured to convert the at least one monolayer of the substrate surface to the modified layer.

9. The method of claim 8, wherein exposing the substrate surface to the plasma includes using a remote plasma source to generate the plasma, and flowing the plasma from the remote plasma source into a chamber in which the substrate is disposed.

10. The method of claim 8, wherein exposing the substrate surface to the plasma includes inductively coupling power into a chamber in which the substrate is disposed.

11. The method of claim 8, wherein exposing the substrate surface to the plasma includes capacitively coupling power into a chamber in which the substrate is disposed.

12. The method of claim 1,
    wherein the substrate surface includes a metal, metal oxide, metal nitride, metal phosphide, metal sulfide, metal arsenide, or metal compound.

13. A method for performing atomic layer etching (ALE) on a substrate, comprising:
    performing a surface modification operation on a substrate surface, the surface modification operation including exposing the substrate surface to a first plasma that converts at least one monolayer of the substrate surface to a modified layer, wherein a bias voltage is applied during the surface modification operation, the bias voltage being configured to control a depth of the substrate surface that is converted by the surface modification operation, wherein the bias voltage is configured to accelerate ions from the first plasma towards the substrate surface without substantially etching the substrate surface;
    performing a removal operation on the substrate surface, the removal operation including removing at least a portion of the modified layer from the substrate surface, wherein removing the portion of the modified layer includes applying thermal energy to effect desorption of the portion of the modified layer;
    performing a clean operation on the substrate surface, the clean operation including removing residues generated by the removal operation from the substrate surface, the clean operation further including exposing the substrate surface to a second plasma, wherein the residues are volatilized by the exposure to the second plasma.

14. The method of claim 13, wherein removing the portion of the modified layer includes a ligand exchange reaction.

15. The method of claim 14, wherein the thermal energy is applied simultaneously with the ligand exchange reaction.

16. The method of claim 14, wherein the thermal energy is applied after the ligand exchange reaction.

17. The method of claim 13,
    wherein the substrate surface includes a metal, metal oxide, metal nitride, metal phosphide, metal sulfide, metal arsenide, or metal compound.

18. A method for performing atomic layer etching (ALE) on a substrate, comprising:
    performing a surface modification operation on a substrate surface, the surface modification operation including exposing the substrate surface to a halogen-containing plasma that converts at least one monolayer of the substrate surface to a modified layer, wherein a bias voltage is applied during the surface modification operation, the bias voltage being configured to control a depth of the substrate surface that is converted by the surface modification operation, wherein the bias voltage is configured to accelerate ions from the first plasma towards the substrate surface without substantially etching the substrate surface;

performing a removal operation on the substrate surface, the removal operation including removing at least a portion of the modified layer from the substrate surface, wherein removing the portion of the modified layer includes a ligand exchange reaction and applying thermal energy to effect desorption of the portion of the modified layer.

19. The method of claim 18, wherein the substrate surface includes a metal, metal oxide, metal nitride, metal phosphide, metal sulfide, metal arsenide, or metal compound;

wherein the exposure to the halogen-containing plasma forms a metal halide.

20. The method of claim 18, wherein exposing the substrate surface to the halogen-containing plasma includes introducing a halogen-containing gas into a chamber in which the substrate is disposed, and igniting the halogen-containing plasma.

21. The method of claim 20, wherein igniting the halogen-containing plasma includes inductively coupling power into the halogen-containing gas.

22. The method of claim 20, wherein igniting the halogen-containing plasma includes capacitively coupling power into the halogen-containing gas.

23. The method of claim 8, wherein exposing the substrate surface to the halogen-containing plasma includes using a remote plasma source to generate the halogen-containing plasma, and flowing the halogen-containing plasma from the remote plasma source into a chamber in which the substrate is disposed.

* * * * *